United States Patent
Tsuchi et al.

(10) Patent No.: US 7,443,239 B2
(45) Date of Patent: Oct. 28, 2008

(54) DIFFERENTIAL AMPLIFIER, DATA DRIVER AND DISPLAY DEVICE

(75) Inventors: Hiroshi Tsuchi, Kanagawa (JP); Junichiro Ishii, Kanagawa (JP); Kouichi Nishimura, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 109 days.

(21) Appl. No.: 11/648,530

(22) Filed: Jan. 3, 2007

(65) Prior Publication Data
US 2007/0159250 A1   Jul. 12, 2007

(30) Foreign Application Priority Data
Jan. 6, 2006   (JP) .............................. 2006-001596

(51) Int. Cl.
*H03F 3/45* (2006.01)
(52) U.S. Cl. ...................................... 330/253; 330/257
(58) Field of Classification Search ................. 330/253, 330/257, 255
See application file for complete search history.

(56) References Cited

U.S. PATENT DOCUMENTS

| | | | |
|---|---|---|---|
| 5,311,145 A | 5/1994 | Huijsing et al. | |
| 6,313,667 B1 * | 11/2001 | Eschauzier | ................... 327/65 |
| 6,441,763 B1 | 8/2002 | Nakao | |
| 6,535,189 B1 | 3/2003 | Akiyama et al. | |
| 6,970,043 B2 * | 11/2005 | Pradhan et al. | ............. 330/253 |
| 2005/0088390 A1 | 4/2005 | Tsuchi | |

FOREIGN PATENT DOCUMENTS

| | | |
|---|---|---|
| JP | 6-326529 | 11/1994 |
| JP | 11-249623 | 9/1999 |
| JP | 2001-34234 | 2/2001 |
| JP | 2002-43944 | 2/2002 |
| JP | 2005-130332 | 5/2005 |

* cited by examiner

*Primary Examiner*—Robert J. Pascal
*Assistant Examiner*—Hieu P Nguyen
(74) *Attorney, Agent, or Firm*—McGinn IP Law Group, PLLC

(57) ABSTRACT

A differential amplifying circuit that includes a differential pair and a cascode current mirror circuit that forms the load circuit of this differential pair. The cascode current mirror circuit includes a control-terminal-coupled first transistor pair, and second and third transistor pairs that receive first and second bias signals at coupled control terminals, respectively. The second transistor pair is straight-connected between the first transistor pair and the input end and the output end of the cascode current mirror circuit, and the third transistor pair is cross-connected between the first transistor pair and the input end and the output end of the cascode current mirror circuit. The second and third transistor pairs are controlled so as to each be placed in active and inactive states by changing over voltage values of the first and second bias signals, with control being exercised in such a manner that when one of these transistor pairs is in an active state, the other is in an inactive state.

21 Claims, 13 Drawing Sheets

FIG. 2

|  | FIRST TIME PERIOD (CONNECTION STATE 1) | SECOND TIME PERIOD (CONNECTION STATE 2) |
|---|---|---|
| SW1,SW3 | ON | OFF |
| SW2,SW4 | OFF | ON |
| SB1 | BP1 | VDD |
| SB1B | VDD | BP1 |
| SB2 | BN1 | VSS |
| SB2B | VSS | BN1 |

FIG. 7

|  | FIRST TIME PERIOD (CONNECTION STATE 1) | SECOND TIME PERIOD (CONNECTION STATE 2) |
|---|---|---|
| SW1,SW3,SW5,SW7 | ON | OFF |
| SW2,SW4,SW6,SW8 | OFF | ON |
| SB1 | BP1 | VDD |
| SB1B | VDD | BP1 |
| SB2 | BN1 | VSS |
| SB2B | VSS | BN1 |

FIG. 8A
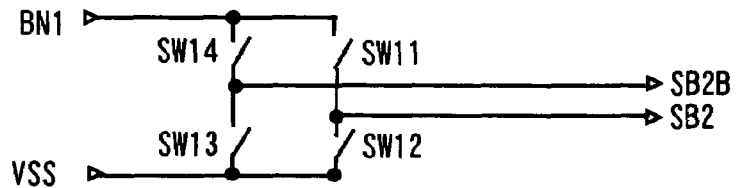
FIG. 8B
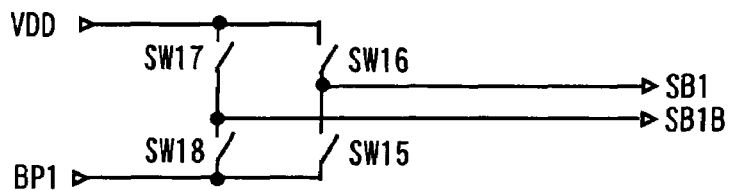
FIG. 8C
|  | FIRST TIME PERIOD (CONNECTION STATE 1) | SECOND TIME PERIOD (CONNECTION STATE 2) |
|---|---|---|
| SW11,SW13,SW15,SW17 | ON | OFF |
| SW12,SW14,SW16,SW18 | OFF | ON |

DIFFERENTIAL AMPLIFIER, DATA DRIVER AND DISPLAY DEVICE

FIELD OF THE INVENTION

This invention relates to a differential amplifier, a data driver and a display device that employs the data driver.

BACKGROUND OF THE INVENTION

Liquid crystal display devices (LCDs) characterized by their thin design, light weight and low power consumption have come into widespread use in recent years and are utilized in the display units of mobile devices such as portable telephones (mobile telephones or cellular telephones), PDAs (Personal Digital Assistants) and laptop personal computers. Recently, however, liquid crystal display devices have come to be provided with large-size screens and techniques for dealing with moving pictures have become more advanced, thus making it possible to realize not only mobile applications but also stay-at-home large-screen display devices and large-screen liquid crystal televisions. Liquid crystal display devices that rely upon active matrix drive and are capable of presenting a high-definition display are being utilized as these liquid crystal displays devices.

The typical structure of an active-matrix liquid crystal display device will be described with reference to FIG. 11. The principal components connected to one pixel of a liquid crystal display unit are illustrated schematically by equivalent circuits in FIG. 11.

In general, a display unit 960 of an active-matrix liquid crystal display device comprises a semiconductor substrate on which transparent pixel electrodes 964 and thin-film transistors (TFTs) 963 are laid out in the form of a matrix (e.g., 1280×3 pixel columns×1024 pixels rows in the case of a color SXGA panel); an opposing substrate on the entire surface of which a single transparent electrode 967 is formed; and a liquid crystal material sealed between these two substrates arranged to oppose each other. The liquid crystal has capacitance and forms a capacitor 965 between the pixel electrodes 964 and electrode 967. Further, an auxiliary capacitor 966 for assisting the capacitance of the liquid crystal is provided.

In the above-described liquid crystal display device, the TFT 963, which has a switching function, is turned on and off under the control of a scan signal. When the TFT 963 is on, a grayscale signal voltage that corresponds to a video data signal is applied to the pixel electrode 964, and the transmittance of the liquid crystal changes owing to a potential difference between each pixel electrode 964 and opposing-substrate electrode 967. This potential difference is held by the liquid crystal capacitance 965 and auxiliary capacitor 966 for a fixed period of time even after the TFT 963 is turned off, as a result of which an image is displayed.

Data lines 962 that send a plurality of level voltages (grayscale signal voltages) applied to pixel electrodes 964 and scan lines 961 that send the scan signal are wired on the semiconductor substrate in the form of a grid (the data lines are 1280×3 in number and the scan lines are 1024 in number in the case of the above-mentioned color SXGA panel). The scan line 961 and data line 962 constitute a large capacitive load owing to the capacitance produced at the intersection of these lines and capacitance, etc., of the liquid crystal sandwiched between the opposing-substrate electrodes.

It should be noted that the scan signal is supplied to the scan line 961 by a gate driver 970, and that the supply of grayscale signal voltage to each pixel electrode 964 is performed by a data driver 980 via the data line 962. Further, the gate driver 970 and data driver 980 are controlled by a display controller (not shown), a required clock CLK, control signals and power-supply voltage, etc., are supplied from the display controller, and video data is supplied from the display controller 940 to the data driver 980. At the present time, video is principally digital data.

Rewriting of one screen of data is carried out over one frame (1/60 of a second), data is selected successively every pixel row (every line) by each scan line, and a grayscale signal voltage is supplied from each data line within the selection interval.

Although the gate driver 970 need only supply at least a bi-level scan signal, it is required that the data driver 980 drive the data lines by grayscale signal voltages of multiple levels that conform to the number of gray levels of the grayscale. To this end, the data driver 980 has a digital-to-analog converter (DAC) comprising a decoder for converting video data to a grayscale signal voltage and an operational amplifier for amplifying the grayscale signal voltage and outputting the amplified signal to the data line 962.

With the progress that has been made in raising image quality (increasing the number of colors) in liquid crystal display devices, there is now growing demand for video data of at least six bits per each of R, G, B (260,000 colors) and even eight bits or more per each of R, G, B (26,800,000 colors). For this reason, a data driver that outputs a grayscale signal voltage corresponding to multiple-bit video data is required to provide a highly accurate output voltage along with a multiple-level grayscale voltage output. For example, if the allowable output voltage accuracy is ½ LSB (Least Significant Bit), we will have approximately ±40 mV in case of six bits and approximately ±10 mV in case of eight bits.

However, the transistors that constitute the driver circuit exhibit a variation in characteristics owing to the fabrication process and hence there is a limit upon the improvement in accuracy of the output voltage. A method of raising the accuracy of output voltage effectively in view of this problem has been proposed in Patent Document 1, cited below.

FIGS. 12A and 12B are diagrams illustrating the circuit configuration of an operational amplifier disclosed in Patent Document 1. This is applied to the driving of a liquid crystal display device. FIGS. 12A and 12B show two connection configurations that depend upon the changeover of switches in one operational amplifier. As shown in FIGS. 12A and 12B, the operational amplifier includes two P-channel MOS transistors (referred to as "PMOS transistors") MP91, MP92 that construct a differential pair; a constant current source I91; N-channel MOS transistors (referred to as "NMOS transistors") MN91, MN92 that construct a current mirror circuit; an NMOS transistor MN93; a constant current source I92; a phase compensating capacitor C91; break-type switches S1, S4, S6, S8 and make-type switches S2, S3, S5, S7.

The drain of one PMOS transistor MP91 constituting the differential pair is connected to the drain of the NMOS transistor MN91. Further, the drain of the other PMOS transistor MP92 constituting the differential pair is connected to the drain of the NMOS transistor MN92.

The constant current source I91, which is inserted between the coupled sources of the PMOS transistors MP91 and MP92 constituting the differential pair and a positive power supply (power supply on the high potential side), biases (supplies a current to) the differential pair. The NMOS transistors MN91 and MN92 constituting the current mirror function as a active load of the differential pair and convert the input differential signal to a single-ended signal.

The NMOS transistor MN93 composes an amplifying circuit of a second stage (output stage). The constant current source I92, which is inserted between the positive power supply VDD and the drain of the NMOS transistor MN93, acts as the active load of the NMOS transistor MN93. The phase compensating capacitor C91 is connected between the gate and drain of the NMOS transistor MN93.

The break-type switch S1 is connected between the gate and drain of NMOS transistor MN91, the make-type switch S2 is connected between the gate and drain of NMOS transistor MN92, the make-type switch S3 is connected between the drain of NMOS transistor MN91 and the gate of NMOS transistor MN93, the break-type switch S4 is connected between drain of NMOS transistor MN92 and the gate of NMOS transistor MN93, the make-type switch S5 is connected between the gate of PMOS transistor MP92 and output terminal Vout, the break-type switch S6 is connected between the gate of PMOS transistor MP91 and output terminal Vout, the make-type switch S7 is connected between the gate of PMOS transistor MP91 and input terminal Vin, and the break-type switch S8 is connected between the gate of PMOS transistor MP92 and input terminal Vin.

The switches S1 to S8 are all gang-controlled and are changed over between odd- and even-numbered frames, by way of example. FIG. 12A illustrates the state of the switch connections at the time of an odd-numbered frame, and FIG. 12B illustrates the state of the switch connections at the time of an even-numbered frame.

When switch S1 is closed in this operational amplifier, as illustrated in FIG. 12A, the drain of NMOS transistor MN92 delivers a single-end output. When switch S2 is closed, as illustrated in FIG. 12B, the drain of the NMOS transistor MN91 delivers a single-end output.

Thus, since the node of the single-end output changes back and forth depending upon the states of switches S1 and S2, the switches S3 and S4 select the output node. The single-end-converted signal selected via the switches S3 and S4 is input to the gate of NMOS transistor MN93, which is the output transistor. At this time the constant current source I92 acts as the active load of the NMOS transistor 93. The drain of NMOS transistor MN93 becomes the output terminal Vout. The phase compensating capacitor C91 performs phase compensation as a mirror capacitor.

Since this operational amplifier is used as a buffer amplifier, the inverting input terminal and output terminal thereof are coupled together in a so-called voltage-follower connection.

By changing over the switches S5 to S8, the inverting input terminal becomes the gate of PMOS transistor MP91 or the gate of PMOS transistor MP92.

In the state of the connections shown in FIG. 12A, the switches S1, S4, S6 and S8 are turned on, the gate of PMOS transistor MP91 is connected to the output terminal Vout as the inverting input terminal, and the gate of PMOS transistor MP92 is connected to the input terminal Vin as the non-inverting input terminal, whereby a voltage-follower connection is obtained.

In the state of the connections shown in FIG. 12B, on the other hand, the switches S2, S3, S5 and S7 are turned on, the gate of PMOS transistor MP91 is connected to the input terminal Vin as the non-inverting input terminal, and the gate of PMOS transistor MP92 is connected to the output terminal Vout as the inverting input terminal, whereby a voltage-follower connection is obtained.

Thus, as a result of changing over the switches S1 to S8, two states of connection exist and the two states of connection are changed over at a prescribed period.

In the state of the switch connections shown in FIG. 12A, assume that an offset voltage (+Vos) is produced.

In this case, if the switches S1 to S8 are changed over from the state of the switch connections of FIG. 12A to obtain the state of the switch connections shown in FIG. 12B, then the offset voltage will be −Vos.

If this operational amplifier is used to drive a liquid crystal display device, voltage is converted to luminance. If an offset voltage is produced, therefore, the luminance will vary. However, there is a limitation upon the resolving power of the human eye in terms of recognizing a change in luminance. If luminance varies in excess of a prescribed period, therefore, the average of this luminance will be recognized.

Accordingly, in an operational amplifier used in driving a liquid crystal display device, offset voltage is averaged effectively, i.e., nulled, by changing over the switches S1 to S8 at the prescribed period or greater.

FIG. 13 is a diagram illustrating the circuit arrangement of a typical amplifier disclosed in Patent Document 2, which is cited below. As shown in FIG. 13, the arrangement is not one in which offset is cancelled by changing over switches as in the amplifier described above with reference to FIGS. 12A and 12B. However, this amplifier will be described for the purpose of comparison with the present invention.

As shown in FIG. 13, the amplifier can be considered upon being divided into an input stage 810, intermediate stage 820 and final stage 830.

The input stage 810 includes PMOS transistors MP80, MP81, MP82 and NMOS transistors MN80, NMN81, MN82.

The intermediate stage 820 includes PMOS transistors MP83, MP84, MP85, MP86, MP87 and MP88 and NMOS transistors MN83, NMN84, MN85, MN86, MN87 and MN88.

The final stage 830 includes a PMOS transistor MP89 and an NMOS transistor MN89.

The amplifier further includes phase compensating capacitors C81, C82 between the intermediate stage 820 and the final stage 830.

The PMOS transistors MP81 and MP82 have their sources coupled together and construct a P-channel differential pair. The PMOS transistor MP80 is connected between this P-channel differential pair and a positive power supply (power supply on the high potential side) VDD. The PMOS transistor MP80 has a source connected to the positive power supply VDD, a drain connected to the coupled sources of PMOS transistors MP81, MP82 and a gate connected to a constant voltage source terminal BP81. The PMOS transistor MP80 acts as a constant current source.

The NMOS transistors MN81 and MN82 have their sources coupled together and construct an N-channel differential pair. The NMOS transistor MN80 is connected between this N-channel differential pair and a negative power supply (power supply on the low potential side) VSS. The NMOS transistor MN80 has a source connected to the negative power supply VSS, a drain connected to the coupled sources of NMOS transistors MN81, MN82 and a gate connected to a constant voltage source terminal BN81. The NMOS transistor MN80 acts as a constant current source.

The gate of PMOS transistor MP81 and the gate of NMOS transistor MN81 are connected in common with an input terminal INN. The gate of the PMOS transistor MP82 and the gate of the NMOS transistor MN82 are connected in common with an input terminal INP.

The drain of the PMOS transistor MP81 is connected to a node C of connection between the drain of the NMOS transistor MN83 and the source of the NMOS transistor MN85 in the intermediate stage 820.

The drain of PMOS transistor MP82 is connected to a node D of connection between the drain of NMOS transistor MN84 and the source of NMOS transistor MN86.

The drain of NMOS transistor MN81 is connected to a node A of connection between the drain of PMOS transistor MP83 and the source of PMOS transistor MP85.

The drain of NMOS transistor MN82 is connected to a node B of connection between the drain of PMOS transistor MP84 and the source of PMOS transistor MP86.

The PMOS transistors MP83, MP84 have their sources coupled together and their gates coupled together, and the coupled sources are connected to the positive power supply VDD. The drains of the PMOS transistors MP83, MP84 are connected to the nodes A and B, respectively.

The PMOS transistor MP85 has its source connected to the node A and its drain connected to the coupled gates of the PMOS transistors MP83, MP84, the source of the PMOS transistor MP87 and the drain of the NMOS transistor MN87.

The PMOS transistor MP86 has its source connected to the node B and its drain to the source of PMOS transistor MP88, the drain of NMOS transistor MN88 and the gate of the PMOS transistor MP89.

The gates of the PMOS transistors MP85, MP86 are coupled together and connected to a constant voltage source terminal BP82.

The NMOS transistors MN83, MN84 have their sources coupled together and their gates coupled together, and the coupled sources are connected to the negative power supply VSS.

The drains of the NMOS transistors MN83, MN84 are connected to the nodes C and D, respectively.

The NMOS transistor MN85 has its source connected to the node C and its drain connected to the coupled gates of the NMOS transistors MN83, MN84, the source of the NMOS transistor MN87 and the drain of the PMOS transistor MP87.

The NMOS transistor MN86 has its source connected to the node D and its drain connected to the source of the NMOS transistor MN88, the drain of the PMOS transistor MP88 and the gate of the NMOS transistor MN89. The gates of the NMOS transistors MN85, MN86 are coupled together and connected to a constant voltage source terminal BN82.

The PMOS transistor MP87 has its gate connected to a constant voltage source terminal BP83, its source connected to the drain of PMOS transistor MP85 and its drain connected to the drain of NMOS transistor MN85.

The NMOS transistor MN87 has its gate connected to a constant voltage source terminal BN83, its source connected to the drain of NMOS transistor MN85 and its drain connected to the drain of PMOS transistor MP85.

The PMOS transistor MP87 and NMOS transistor MN87 act as floating current sources.

The PMOS transistor MP88 has its gate connected to a constant voltage source terminal BP84, its source connected to the drain of PMOS transistor MP86 and its drain connected to the drain of NMOS transistor MN86.

The NMOS transistor MN88 has its gate connected to a constant voltage source terminal BN84, its source connected to the drain of the NMOS transistor MN86 and its drain connected to the drain of the PMOS transistor MP86.

The PMOS transistor MP88 and NMOS transistor MN88 act as floating current sources.

The PMOS transistor MP89 has a source connected to the positive power supply VDD, a gate connected to the source of the PMOS transistor MP88 and a drain connected to the output terminal OUT. This is an output transistor.

The NMOS transistor MN89 has a source connected to the negative power supply VSS, a gate connected to the source of the PMOS transistor MN88 and a drain connected to the output terminal OUT. This is an output transistor.

The phase compensating capacitor C81 has a first end connected to the node B and a second terminal connected to the output terminal OUT. The phase compensating capacitor C82 has a first end connected to the node D and a second terminal connected to the output terminal OUT.

The differential amplifier illustrated in FIG. 13 is a so-called "rail-to-rail amplifier" (a full-range amplifier). The input stage 810 is a differential stage obtained by bundling the PMOS-transistor differential pair and the NMOS-transistor differential pair in order to implement the rail-to-rail capability. Accordingly, it is necessary to couple the outputs of the PMOS-transistor differential pair and the outputs of the NMOS-transistor differential pair.

The outputs of the differential stage, therefore, are connected to the nodes A, B and C, D of so-called folded-cascode connections.

By virtue of this connection, the outputs of the PMOS-transistor differential pair and NMOS-transistor differential pair are coupled in terms of current.

The NMOS-transistor differential pair operates within an input-signal voltage range in which the PMOS-transistor differential pair does not operate. Conversely, the PMOS-transistor differential pair operates within an input-signal voltage range in which the NMOS-transistor differential pair does not operate. As a result, it is possible to obtain an input stage that operates in the full input range of power supply voltages (VDD to VSS).

[Patent Document 1]
Japanese Patent Kokai Publication No. JP-A-11-249623 (FIG. 14)

[Patent Document 2]
Japanese Patent Kokai Publication No. JP-A-6-326529 (FIG. 1)

[Patent Document 3]
Japanese Patent Kokai Publication No. JP-P2001-34234A (FIG. 5)

[Patent Document 4]
Japanese Patent Kokai Publication No. JP-P2002-43944A (FIGS. 2 and 3)

[Patent Document 5]
Japanese Patent Kokai Publication No. JP-P2005-130332A (FIGS. 1 and 26)

SUMMARY OF THE DISCLOSURE

The circuit illustrated in FIGS. 12A and 12B can serve as a differential amplifier for canceling offset, as described above, and if this design is adopted, no particular problems arise. Although the circuit shown in FIGS. 12A and 12B is a P-channel differential pair, a differential amplifier that includes an N-channel differential pair can also be obtained merely by reversing the polarities (conductivity types) of the transistors in FIGS. 12A and 12B.

However, there are cases where switching control based upon FIGS. 12A and 12B cannot be applied as is in differential amplifiers other than that described above.

For example, if it is attempted to introduce an operating principle the same as that shown in FIGS. 12A and 12B into the differential amplifier illustrated in FIG. 13, for example, the circuit configuration becomes much more complex and such an arrangement is not realistic.

That is, if an attempt is made to introduce the changeover of active load into the circuit illustrated in FIG. 13, the desired operation is not performed by mere interchanging of the transistors acting as the active loads.

More specifically, the circuit of FIG. 13 will not operate as desired merely by interchanging the inputs and outputs of the current mirror circuits of the PMOS transistors MP83 to MP86 and NMOS transistors MN83 to MN86 and changing the connections to the gates of the output transistors MP89, MN89.

It is necessary to change over all of the connections from the transistors MP87, MN87, which decide the idling current of the intermediate stage 820, to the active load and the connections between the transistors MP88, MN88, which decide the idling current of the final stage 830, and the output transistors M89, MN89.

If it is attempted to implement this changeover control, a problem is that the number of switches necessary for changeover becomes enormous and amplifier area increases.

Accordingly, implementation of a differential amplifying circuit or operational amplifier that makes it possible to diminish the effects of offset with a simple circuit arrangement is desired. The present invention has been newly devised in its entirety based upon recognition of the foregoing problems by the inventors. In order to solve the foregoing problems, the present invention has the structure set forth below.

A differential amplifying circuit according to a first aspect of the present invention comprises: at least one differential pair of transistors; and a load circuit connected to said differential pair; said load circuit comprising a cascode current mirror circuit including: a first transistor pair for folding back current from said differential pair; and a cascode section cascade-connected to said first transistor pair, wherein the configuration of connection between said first transistor pair and an input end and an output end of said cascode current mirror circuit is changed over between straight connection via said cascode section and cross connection via said cascode section, responsive to control signals applied to thereto.

In the present invention, the cascode section preferably has second and third transistor pairs cascade-connected to the first transistor pair, wherein the second transistor pair is straight-connected between the first transistor pair and the input end and the output end of the cascode current mirror circuit, and the third transistor pair is cross-connected between the first transistor pair and the input end and the output end of the cascode current mirror circuit. The control signals include first and second bias signals and they control the second and third transistor pairs so as to place these transistor pairs in an active and inactive states by changing over respective voltage values of the first and second bias signals applied to these transistor pairs, with control being exercised in such a manner that when one transistor pair is in an active state, the other is in an inactive state.

In the present invention, the first transistor pair preferably includes first and second transistors having first signal terminals connected in common with a first power supply and control terminals coupled together. The second transistor pair includes third and fourth transistors having first signal terminals connected to the second signal terminals of the first and second transistors, respectively, and control terminals coupled together. The third transistor pair includes fifth and sixth transistors having first signal terminals connected to the second signal terminals of the second and first transistors, respectively, and control terminals coupled together. Second signal terminals of the third and fifth transistors are coupled together and form the input end of the cascode current mirror circuit, and are connected to the coupled control terminals of the first and second transistors. Second signal terminals of the fourth and sixth transistors are coupled together and form the output end of the cascode current mirror circuit. The first bias signal is connected to the coupled control terminals of the third and fourth transistors, the second bias signal is connected to the coupled control terminals of the fifth and sixth transistors, and the first and second bias signals have voltage values that are capable of being changed over.

In the present invention, preferably a pair of outputs of the differential pair are connected to respective ones of a node of connection among the second signal terminal of the first transistor and the first signal terminals of each of the third and sixth transistors, and a node of connection among the second signal terminal of the second transistor and the first signal terminals of each of the fourth and fifth transistors.

In the present invention, another cascode current mirror circuit having a conductivity type opposite that of the first-mentioned cascode current mirror circuit is provided and placed between first and second power supplies in opposition to the first-mentioned cascode current mirror circuit, wherein the other cascode current mirror circuit further includes a sixth transistor pair in addition to cascode-connected fourth and fifth transistor pairs; the fifth transistor pair is straight-connected between the fourth transistor pair and an input end and an output end of the other cascode current mirror circuit, the sixth transistor pair is cross-connected between the fourth transistor pair and the input end and the output end of the other cascode current mirror circuit; and the fifth and sixth transistor pairs are controlled so as to be placed in active and inactive states by changing over respective voltage values of third and fourth bias signals applied to these transistor pairs, with control being exercised in such a manner that when one transistor pair is in an active state, the other is in an inactive state.

In the present invention, the fourth transistor pair includes seventh and eighth transistors having first signal terminals connected in common with the second power supply and control terminals coupled together. The fifth transistor pair includes ninth and tenth transistors having first signal terminals connected to the second signal terminals of the seventh and eighth transistors, respectively, and control terminals coupled together. The sixth transistor pair includes 11th and 12th transistors having first signal terminals connected to the second signal terminals of the eight and seventh transistors, respectively, and control terminals coupled together. Second signal terminals of the ninth and 11th transistors are coupled together and form the input end of the other cascode current mirror circuit, and are connected to the coupled control terminals of the seventh and eighth transistors. The second signal terminals of the tenth and 12th transistors are coupled together and form the output end of the other cascode current mirror circuit. The third bias signal is connected to the coupled control terminals of the ninth and tenth transistors, the fourth bias signal is connected to the coupled control terminals of the 11th and 12th transistors, and the third and fourth bias signals have voltage values that are capable of being changed over.

In the present invention, the differential amplifying circuit may further comprise another differential pair having a conductivity type opposite that of the first-mentioned differential pair, wherein inputs of an input pair of the other differential pair of the opposite conductivity type are connected to respective inputs of an input pair of the first-mentioned differential pair, and an output pair of the other differential pair of the opposite conductivity type is connected to the other cascode current mirror circuit.

In the present invention, a current source circuit is provided between the input end of the first-mentioned cascode current mirror circuit and the input end of the other cascode current mirror circuit, and another current source circuit is provided between the output end of the first-mentioned cascode current mirror circuit and the output end of the other cascode current mirror circuit.

In the present invention, the differential amplifying circuit further comprises an output amplifying stage having an input end connected to the output end of the cascode current mirror circuit and an output end connected to the output terminal of the differential amplifying circuit.

In the present invention, the differential amplifying circuit further comprises an output amplifying stage having input ends connected to respective ones of the output end of the first-mentioned cascode current mirror circuit and the output end of the other cascode current mirror circuit, and an output end connected to the output terminal of the differential amplifying circuit.

In the present invention, the output amplifying stage may include a first output transistor connected between the first power supply and the output terminal of the differential amplifying circuit and having a control terminal to which the output end of the first-mentioned cascode current mirror circuit is connected; and a second output transistor connected between the second power supply and the output terminal of the differential amplifying circuit and having a control terminal to which the output end of the other cascode current mirror circuit is connected.

In the present invention, the output amplifying stage may include an input changeover circuit for changing over connections between first and second inputs the pair of inputs of the differential pair and the input and output terminals of the differential amplifying circuit. The input changeover circuit controls changeover so as to connect the first and second inputs to the input terminal and the output terminal, respectively, of the differential amplifying circuit or so as to connect the first and second inputs to the output terminal and the input terminal, respectively, of the differential amplifying circuit. In the present invention, the changeover of voltage values of first and second bias signals and the changeover of connections between the first and second inputs the pair of inputs of the differential pair and the input and output terminals of the differential amplifying circuit in the input changeover circuit are performed in operative association.

In the present invention, the differential amplifying circuit further comprises another differential pair of the same conductivity type as that of the first-mentioned differential pair having a pair of outputs connected to respective outputs of the first-mentioned differential pair and sharing the load circuit, wherein connections between the pair of inputs the other differential pair of the same conductivity type and the corresponding input terminals also are changed over in operative association with the changeover of voltage values of the first and second bias signals.

In the present invention, the differential amplifying circuit further comprises a circuit which, when one bias signal of the first and second bias signals has a voltage value that sets to an active state the transistor pair to which the one bias signal is connected, sets the other bias signal to a voltage value that sets to an inactive state the transistor pair to which this other bias signal is connected.

In the present invention, the differential amplifying circuit further comprises a circuit which, when one bias signal of the third and fourth bias signals has a voltage value that sets to an active state the transistor pair to which the one bias signal is connected, sets the other bias signal to a voltage value that sets to an inactive state the transistor pair to which this other bias signal is connected.

A differential amplifying circuit according to another aspect of the present invention comprises a first differential pair driven by a first current source and comprising a transistor pair of a first conductivity type; a first cascode current mirror circuit forming a load circuit of the first differential pair; a second differential pair driven by a second current source and comprising a transistor pair of a second conductivity type; a second cascode current mirror circuit forming a load circuit of the second differential pair; and an output amplifying stage having input ends connected to respective ones of an output end of the first cascode current mirror circuit and an output end of the second cascode current mirror circuit, and an output end connected to an output terminal of the differential amplifying circuit; wherein input pairs of the first and second differential pairs are coupled together.

The first cascode current mirror circuit includes a first transistor pair having control terminals coupled together, and second and third transistor pairs for receiving first and second bias signals at respective ones of coupled control terminals thereof; wherein the first to third transistor pairs are of a second conductivity type, the second transistor pair is straight-connected between the first transistor pair and the input end and the output end of the first cascode current mirror circuit, and the third transistor pair is cross-connected between the first transistor pair and the input end and the output end of the first cascode current mirror circuit.

Further, in the present invention, the second cascode current mirror circuit includes a fourth transistor pair having control terminals coupled together, and fifth and sixth transistor pairs for receiving third and fourth bias signals at respective ones of coupled control terminals thereof; wherein the fourth to sixth transistor pairs are of a first conductivity type, the fifth transistor pair is straight-connected between the fourth transistor pair and the input end and the output end of the second cascode current mirror circuit, and the sixth transistor pair is cross-connected between the fourth transistor pair and the input end and the output end of the second cascode current mirror circuit. Further, voltage values of the first and second bias signals applied to the second and third transistor pairs are controlled in such a manner that when one of these transistor pairs attains an active state, the other attains an inactive state; voltage values of the third and fourth bias signals applied to the fifth and sixth transistor pairs are controlled in such a manner that when one of these transistor pairs attains an active state, the other attains an inactive state; activation and deactivation of the straight-connected second and fifth transistor pairs is controlled at the same timing; and activation and deactivation of the cross-connected third and sixth transistor pairs is controlled at the same timing.

In the present invention, the differential amplifying circuit may further comprise an input changeover circuit for changing over connections between coupled first and second inputs of the input pairs of the first and second differential pairs and the input and the output terminals of the differential amplifying circuit; wherein the input changeover circuit controls changeover so as to connect the first and second inputs to the input terminal and the output terminal, respectively, of the differential amplifying circuit when the second and fifth transistor pairs have been activated, and connect the first and second inputs to the output terminal and the input terminal, respectively, of the differential amplifying circuit when the third and sixth transistor pairs have been activated.

A differential amplifying circuit according to another aspect of the present invention comprises: at least one differential pair of transistors; and a load circuit connected to said differential pair; said load circuit comprising a cascode current mirror circuit including: a first transistor pair; and a cascode section cascade-connected between said first transistor pair and an input end and an output end of said cascode current mirror circuit; wherein the configuration of connection between said first transistor pair and the input end and the output end of said cascode current mirror circuit, responsive to control signals applied to thereto, is changed over between straight connection and cross connection via said cascode section.

A data driver and a display device according to the present invention have the above-described differential amplifying circuit as a buffer circuit.

A cascode current mirror circuit according to the present invention comprises: first and second transistors forming a current mirror having first signal terminals connected in common with a power supply and control terminals coupled together; third and fourth transistors having first signal terminals connected to second signal terminals of the first and second transistors, respectively, and receiving a first bias signal at the coupled control terminals; and fifth and sixth transistors having first signal terminals connected to the second signal terminals of the second and first transistors, respectively, and receiving a second bias signal at coupled control terminals; wherein the second signal terminals of the third and fifth transistors are coupled together, thereby forming an input end of the cascode current mirror circuit, and are connected to coupled control terminals of the first and second transistors; and the second signal terminals of the fourth and sixth transistors are coupled together, thereby forming an output end of the cascode current mirror circuit.

The meritorious effects of the present invention are summarized as follows.

In accordance with the present invention, an operational amplifier that is little affected by offset voltage can be provided through a simple circuit arrangement. The operational amplifier is applied to an LCD driver, which is a typical circuit in the video field.

BRIEF DESCRIPTION OF THE DRAWINGS

FIG. 2 is a diagram illustrating control of switches and bias voltages in FIG. 1;

FIG. 7 is a diagram illustrating control of switches and bias voltages in FIG. 6;

FIGS. 8A and 8B are diagrams of circuits for generating bias, and FIG. 8C is a diagram illustrating an example of ON/OFF control of switches;

DETAILED DESCRIPTION OF THE INVENTION

Figure 1:
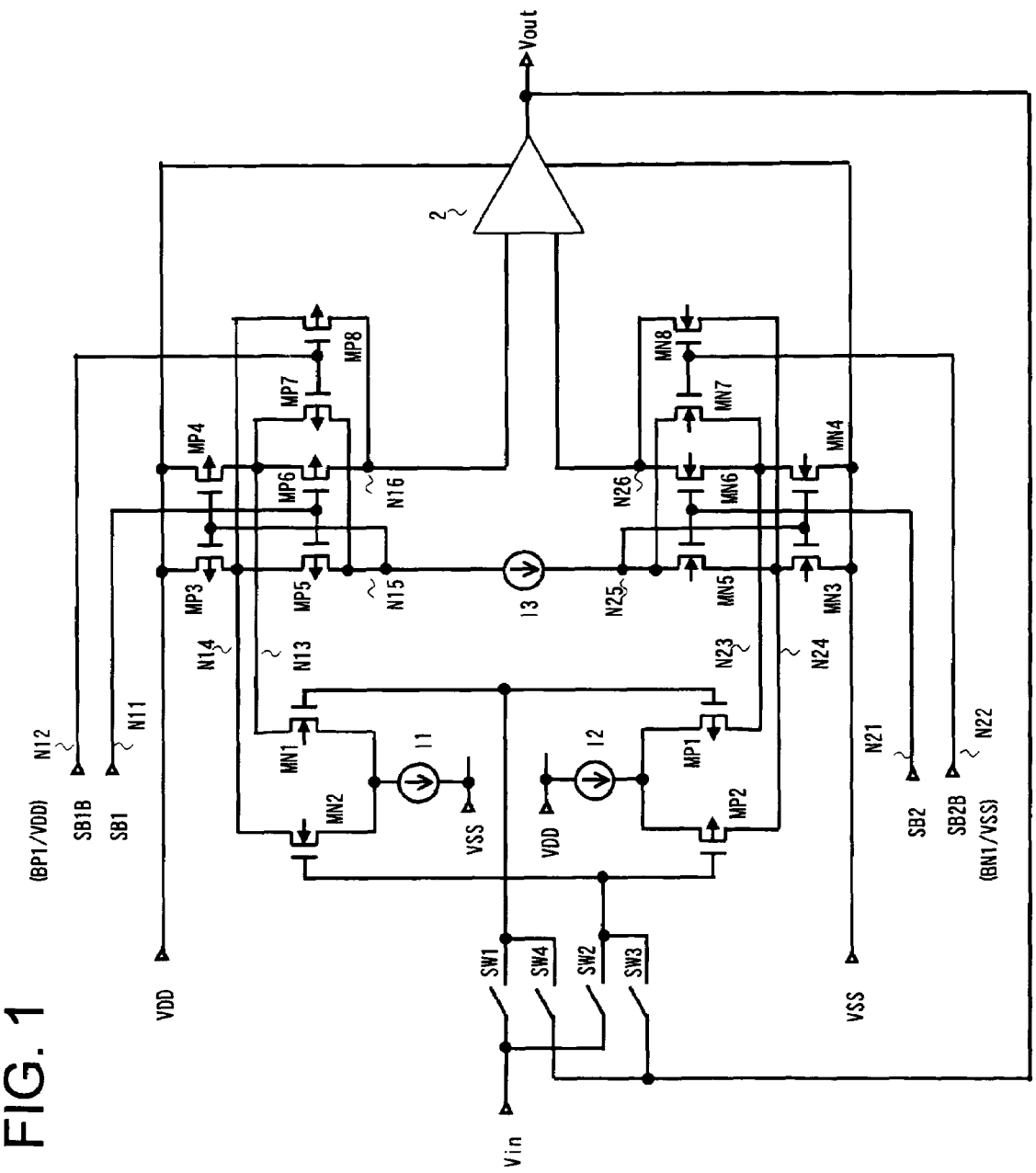
FIG. 1 is a diagram illustrating the configuration of a first embodiment according to the present invention.

The present invention will be described in detail with reference to the drawings.

A differential amplifying circuit according to the present invention comprises: at least one differential pair and a load circuit connected to the differential pair. The load circuit comprises a cascode current mirror circuit that includes a first transistor pair for folding back current from the differential pair, and a cascode section cascode-connected to the first transistor pair. The cascode current mirror circuit is adapted to freely change over the form of connection between the first transistor pair and an input end and an output end of the cascode current mirror circuit to a straight connection or cross connection via the cascode section based upon control signals. More specifically, in the differential amplifying circuit according to the F present invention, the load circuit of at least one differential pair (e.g., NMOS-transistor pair MN1 and MN2) has a cascode current mirror circuit that includes a first transistor pair (PMOS transistors MP3 and MP4) for folding the output current of the differential pair (MN1, MN2), and a cascode section cascode-connected to the first transistor pair (MP3, MP4). The cascode current mirror circuit changes over the connection between the first transistor pair (MP3, MP4) and an input end N15 and an output end N16 of the cascode current mirror circuit to a straight connection or cross connection via the cascode section, responsive to first and second bias signals (control signals) SB1 and SB1B applied thereto. In this circuit configuration, the relationship between an inverting input and a non-inverting input of the differential pair (MN1, MN2) is switched in conformity with the changeover between the straight connection and cross connection.

The cascode section preferably has second and third transistor pairs (PMOS transistors MP5 and MP6 and PMOS transistors MP7 and MP8) cascode-connected to the first transistor pair (MP3, MP4). The second transistor pair (MP5, MP6) is straight-connected between drains N14, N13 of the first transistor pair (MP3, MP4) and the input end N15 and the output end N16 of the cascode current mirror circuit (namely between N14 and N15 and between N13 and N16), and the third transistor pair (MP7, MP8) is cross-connected between drains N14, N13 of the first transistor pair (MP3, MP4) and the input end N15 and output end N16 of the cascode current mirror circuit (namely between N13 and N15 and between N14 and N16). The first and second bias signals SB1 and SB1B control the second transistor pair (MP5, MP6) and the third transistor pair (MP7, MP8) so as to place these transistor pairs in active and inactive states by changing over respective voltage values of the first and second bias signals applied to these transistor pairs. Control is exercised in such a manner that when one transistor pair is in an active state, the other is in an inactive state.

Another load circuit of a differential pair (PMOS-transistor pair) having a conductivity type different from that of the differential pair (MN1, MN2) also has a similarly constructed second cascode current mirror circuit that includes a fourth transistor pair (NMOS transistors MN3 and MN4) for folding the output current of the differential pair (MP1, MP2), and a second cascode section cascode-connected to the fourth transistor pair (MN3, MN4). The second cascode current mirror circuit changes over the connection between the fourth transistor pair (MN3, MN4) and an input end N25 and output end N26 of the second cascode current mirror circuit to a straight connection or cross connection via the second cascode section based upon third and fourth bias signals SB2 and SB2B.

The second cascode section preferably has fifth and sixth transistor pairs (NMOS transistors MN5 and MN6 and NMOS transistors MN7 and MN8) cascode-connected to the fourth transistor pair (MN3, MN4). The fifth transistor pair (MN5, MN6) is straight-connected between drains N24 and N23 of the fourth transistor pair and an input end N25 and an output end N26 of the second cascode current mirror circuit (namely between N24 and N25 and between N23 and N26), and the sixth transistor pair (MN7, MN8) is cross-connected between drains N24 and N23 of the fourth transistor pair and the input end N25 and the output end N26 of the second cascode current mirror circuit (namely between N23 and N25 and between N24 and N26). The third and fourth bias signals SB2 and SB2B control the fifth transistor pair (MP5, MP6) and the sixth transistor pair (MN7, MN8) so as to place these transistor pairs in active and inactive states by changing over respective voltage values of the third and fourth bias signals applied to these transistor pairs. Control is exercised in such a manner that when one transistor pair is in an active state, the other is in an inactive state.

In the present invention thus configured, the second and third transistor pairs of the cascode current mirror circuit are controlled so as to be changed over alternatively to active and inactive states by changing over the voltage values of the first and second bias signals supplied thereto. This changeover control is accompanied by switching of the relationship between the inverting and non-inverting inputs of the differential pair (MN1, MN2). If a voltage-follower arrangement in which the output terminal of the differential amplifying circuit is connected to the inverting input and the input signal is supplied to the non-inverting input is adopted, then even in the event that a variation develops in the characteristics of the MOS transistors that construct the differential amplifying circuit (e.g., a variation in threshold-value voltage), an output offset can be reversed in polarity by such changeover control. Output offset can be cancelled out by performing such changeover periodically. According to the present invention, the effects of offset can be suppressed through a simple circuit arrangement in a differential amplifier having a cascode current mirror.

FIG. 1 is a diagram illustrating the configuration of a differential amplifying circuit according to a first embodiment of the present invention. As shown in FIG. 1, the differential amplifying circuit includes source-coupled NMOS transistors MN1 and MN2 constituting a first differential pair; source-coupled PMOS transistors MP1 and MP2 forming a second differential pair; a first constant current source I1 connected between the coupled sources of the NMOS transistors MN1 and MN2 constituting the first differential pair and a power supply VSS on the low potential side; and a second constant current source I2 connected between the coupled sources of the PMOS transistors MP1 and MP2 constituting the second differential pair and a power supply VDD on the high potential side. The gates of the NMOS transistors MN1 and MN2 constituting the first differential pair are connected to the gates of the PMOS transistors MP1 and MP2, respectively, constituting the second differential pair.

The differential amplifying circuit has a first cascode current mirror circuit as the load circuit of the first differential pair (MN1, MN2).

The first cascode current mirror circuit includes the following:

(a) a PMOS transistor MP3 having a source connected to the power supply VDD on the high potential side;

(b) a PMOS transistor MP4 having a source connected to the power supply VDD on the high potential side and a gate connected to the gate of the PMOS transistor MP3;

(c) a PMOS transistor MP5 having a source connected to the drain (node N14) of the PMOS transistor MP3 and a drain connected to terminal N15;

(d) a PMOS transistor MP6 having a source connected to the drain (node N13) of the PMOS transistor MP4, a gate connected to the gate of the PMOS transistor MP5 and a drain connected to terminal N16;

(e) a PMOS transistor MP7 having a source connected to the drain (node N13) of the PMOS transistor MP4 and a drain connected to terminal N15; and (f) a PMOS transistor MP8 having a source connected to the drain (node N14) of the PMOS transistor MP3, a gate connected to the gate of the PMOS transistor MP7 and a drain connected to terminal N15.

The terminal N15 is connected to the coupled gates of the PMOS transistors MP3 and MP4. The nodes N15, N16 form input and output ends, respectively, of the first cascode current mirror circuit.

The bias signal SB1 is supplied to the coupled gates (node N11) of the PMOS transistors MP5 and MP6, and the bias signal SB1B is supplied to the coupled gates (node N12) of the PMOS transistors MP7 and MP8.

An AC signal of a voltage BP1 and the high-potential power supply voltage VDD is supplied as the bias signal SB1, and a signal that is the complement (inverse) of the signal SB1 is supplied as the bias signal SB1B. That is, when the signal SB1 is BP1, the signal SB1B is VDD, and when the signal SB1 is VDD, the signal SB1B is BP1.

The drains (N14, N13) of the transistor pair (also referred to as a "current mirror pair") (MP3, MP4) of the first cascode current mirror circuit are connected to terminals N15, N16 via the activated transistor pair (also referred to as a "bias pair") (MP5, MP6), and are changed over and connected to terminals N16, N15 via the activated transistor pair (also referred to as a "bias pair") (MP8, MP7). The bias pair (MP5, MP6) is activated (turned on) when the voltage BP1 is supplied as the bias signal SB1, and is deactivated (turned off) when the voltage VDD is supplied. The bias pair (MP7, MP8) is activated (turned on) when the voltage BP1 is supplied as the bias signal SB1B, and is deactivated (turned off) when the voltage VDD is supplied.

The drain (one output of the output pair) of the NMOS transistor MN1 constituting the first differential pair is connected to node N13 at which the drain of PMOS transistor MP4 and the sources of PMOS transistors MP6 and MP7 are coupled together. The drain (the other output of the output pair) of the NMOS transistor MN2 constituting the first differential pair is connected to node N14 at which the drain of PMOS transistor MP3 and the sources of PMOS transistors MP5, MP8 are coupled together.

In this arrangement, the first cascode current mirror circuit constitutes a so-called "folded cascode current mirror circuit" that folds the output current of the first differential pair (MN1, MN2) using the PMOS transistors MP3 and MP4. For example, when the bias signals SB1 and SB1B are BP1 and VDD, respectively, the bias pair (MP7, MP8) is deactivated (turned off) and the current mirror pair (MP3, MP4) and bias pair (MP5, MP6) form a folded cascode current mirror circuit. At this time the input current at the input end N15 of the first cascode current mirror circuit is equal to the current of PMOS transistor MP5 of the bias pair and is a current obtained by subtracting the current of NMOS transistor MN2 of the first differential pair from the current of PMOS transistor MP3 of the current mirror pair. The output current of the output end N16 of the first cascode current mirror circuit is equal to the current of PMOS transistor MP6 of the bias pair and is a current obtained by subtracting the current of NMOS transistor MN1 of the first differential pair from the current of PMOS transistor MP4 of the current mirror pair.

The transistors constituting the first differential pair (MN1, MN2) usually are of the same size, and the same is true for the transistors forming the current mirror pair (MP3, MP4) and bias pair (MP5, MP6). When the currents between the transistors of the first differential pair (MN1, MN2) are equal, the input current and the output current of the first cascode current mirror circuit are equal.

On the other hand, if a difference in current develops between the transistors of the first differential pair (MN1, MN2), then this will be reflected as a current difference between the input current and the output current of the first cascode current mirror circuit. At this time the current mirror pair (MP3, MP4), whose gates are coupled together and whose sources are coupled together, acts so as to pass equal currents. Therefore, when the current of transistor MN1 of the first differential pair is larger than the current of transistor MN2, the output current of the first cascode current mirror circuit is smaller than the input current. When the current of transistor MN1 of the first differential pair is smaller than the current of transistor MN2, the output current of the first cascode current mirror circuit is larger than the input current.

Further, when the bias signals SB1 and SB1B are VDD and BP1, respectively, the bias pair (MP5, MP6) is deactivated (turned off) and the current mirror pair (MP3, MP4) and bias pair (MP7, MP8) form a folded cascode current mirror circuit. At this time the input current at the input end N15 of the first cascode current mirror circuit is equal to the current of PMOS transistor MP7 of the bias pair and is a current obtained by subtracting the current of NMOS transistor MN1 of the first differential pair from the current of PMOS transistor MP4 of the current mirror pair. The output current of the output end N16 of the first cascode current mirror circuit is equal to the current of PMOS transistor MP8 of the bias pair and is a current obtained by subtracting the current of NMOS transistor MN2 of the first differential pair from the current of PMOS transistor MP3 of the current mirror pair.

The transistors forming the bias pair (MP7, MP8) usually are of the same size. When the currents between the transistors of the first differential pair (MN1, MN2) are equal, the input current and the output current of the first cascode current mirror circuit are equal.

On the other hand, if a difference in current develops between the transistors of the first differential pair (MN1, MN2), then this will be reflected as a current difference between the input current and the output current of the first cascode current mirror circuit. At this time the current mirror pair (MP3, MP4) acts so as to pass equal currents. Therefore, when the current of transistor MN1 of the first differential pair is larger than the current of transistor MN2, the output current of the first cascode current mirror circuit is larger than the input current. When the current of transistor MN1 of the first differential pair is smaller than the current of transistor MN2, the output current of the first cascode current mirror circuit is smaller than the input current. The action that the output current of the first differential pair has upon the output current of the first cascode current mirror circuit at this time is the reverse of the action when the bias signals SB1 and SB1B are BP1 and VDD, respectively. Further, as for the currents of each of the transistors, the current of the NMOS transistors MN1 and MN2 is drain-to-source current, and the current of the PMOS transistors MP3 to MP8 is source-to-drain current.

The differential amplifying circuit has a second cascode current mirror circuit as the load circuit of the second differential pair (MP1, MP2). That is, the second cascode current mirror circuit includes the following:

(a) an NMOS transistor MN3 having a source connected to the power supply VSS on the low potential side;

(b) an NMOS transistor MN4 having a source connected to the power supply VSS on the low potential side and a gate connected to the gate of the PMOS transistor MN3;

(c) an NMOS transistor MN5 having a source connected to the drain (node N24) of the NMOS transistor MN3 and a drain connected to terminal N25;

(d) an NMOS transistor MN6 having a source connected to the drain (node N23) of the NMOS transistor MN4, a gate connected to the gate of the NMOS transistor MN5 and a drain connected to terminal N26;

(e) an NMOS transistor MN7 having a source connected to the drain (node N23) of the NMOS transistor MN4 and a drain connected to terminal N25; and (f) an NMOS transistor MN8 having a source connected to the drain (node N24) of the NMOS transistor MN3, a gate connected to the gate of the NMOS transistor MN7 and a drain connected to terminal N26.

The terminal N25 is connected to the coupled gates of the NMOS transistors MN3 and MN4. The terminals N25 and N26 form input and output ends, respectively of the second cascode current mirror circuit.

The bias signal SB2 is supplied to the coupled gates (N21) of the NMOS transistors MN5 and MN6, and the bias signal SB1B is supplied to the coupled gates (N22) of the NMOS transistors MN7 and MN8.

An AC signal of a voltage BN1 and the low-potential power supply voltage VSS is supplied as the bias signal SB2, and a signal that is the complement (inverse) of the signal SB2 is supplied as the bias sing SB2B. That is, when the signal SB2 is BN1, the signal SB2B is VSS, and when the signal SB2 is VSS, the signal SB2B is BN1.

The drains (N24, N23) of the transistor pair (also referred to as a "current mirror pair") (MN3, MN4) of the second cascode current mirror circuit are connected to terminals N25 and N26 via the activated transistor pair (also referred to as a "bias pair") (MN5, MN6), and are changed over and connected to terminals N26, N25 via the activated transistor pair (also referred to as a "bias pair") (MN8, MN7). The bias pair (MN5, MN6) is activated (turned on) when the voltage BN1 is supplied as the bias signal SB2, and is deactivated (turned off) when the voltage VSS is supplied. The bias pair (MN7, MN8) is activated (turned on) when the voltage BN1 is supplied as the bias signal SB2B, and is deactivated (turned off) when the voltage VSS is supplied.

The drain of one transistor MP1 of the transistor pair of the second differential pair (MP1, MP2) is connected to node N23 at which the drain of NMOS transistor MN4 and the sources of NMOS transistors MN6, MN7 are coupled together.

The drain of the other transistor MP2 of the transistor pair of the second differential pair is connected to node N24 at which the drain of NMOS transistor MN3 and the sources of NMOS transistors MN5, MN8 are coupled together.

In this arrangement, the second cascode current mirror circuit constitutes a folded cascode current mirror circuit that folds the output current of the second differential pair (MP1, MP2) using the NMOS transistors MN3 and MN4. The second cascode current mirror circuit has a polarity (conductivity type) that is the reverse of that of the first cascode current mirror circuit.

When the bias signals SB2 and SB2B are BN1 and VSS, respectively, the bias pair (MN7, MN8) is deactivated (turned off) and the current mirror pair (MN3, MN4) and bias pair (MN5, MN6) form a folded cascode current mirror circuit. At this time the input current at the input end N25 of the second cascode current mirror circuit is equal to the current of NMOS transistor MN5 of the bias pair and is a current obtained by subtracting the current of PMOS transistor MP2 of the second differential pair from the current of NMOS transistor MN3 of the current mirror pair. The output current of the output end N26 of the second cascode current mirror circuit is equal to the current of NMOS transistor MN6 of the bias pair and is a current obtained by subtracting the current of PMOS transistor MP1 of the second differential pair from the current of NMOS transistor MN4 of the current mirror pair.

The transistors constituting the second differential pair (MP1, MP2) usually are of the same size, and the same is true for the transistors forming the current mirror pair (MN3, MN4) and bias pair (MN5, MN6). When the currents between the transistors of the second differential pair (MP1, MP2) are equal, the input current and the output current of the second cascode current mirror circuit are equal.

On the other hand, if a difference in current develops between the transistors of the second differential pair (MP1, MP2), then this will be reflected as a current difference between the input current and the output current of the second cascode current mirror circuit. At this time the current mirror pair (MN3, MN4), whose gates are coupled together and whose sources are coupled together, acts so as to pass equal currents. Therefore, when the current of transistor MP1 of the second differential pair is larger than the current of transistor MP2, the output current of the second cascode current mirror circuit is smaller than the input current. When the current of transistor MP1 of the second differential pair is smaller than the current of transistor MP2, the output current of the second cascode current mirror circuit is larger than the input current.

Further, when the bias signals SB2 and SB2B are VSS and BN1, respectively, the bias pair (MN5, MN6) is deactivated (turned off) and the current mirror pair (MN3, MN4) and bias pair (MN7, MN8) form a folded cascode current mirror circuit. At this time the input current at input end N25 of the second cascode current mirror circuit is equal to the current of PMOS transistor MN7 of the bias pair and is a current obtained by subtracting the current of PMOS transistor MP1 of the second differential pair from the current of NMOS transistor MN4 of the current mirror pair. The output current of output end N26 of the second cascode current mirror circuit is equal to the current of NMOS transistor MN8 of the bias pair and is a current obtained by subtracting the current of NMOS transistor MP2 of the second differential pair from the current of NMOS transistor MN3 of the current mirror pair.

The transistors forming the bias pair (MN7, MN8) usually are of the same size. When the currents between the transistors of the second differential pair (MP1, MP2) are equal, the input current and the output current of the second cascode current mirror circuit are equal.

On the other hand, if a difference in current develops between the transistors of the second differential pair (MP1, MP2), then this will be reflected as a current difference between the input current and the output current of the second cascode current mirror circuit. At this time the current mirror pair (MN3, MN4) acts so as to pass equal currents. Therefore, when the current of transistor MP1 of the second differential pair is larger than the current of transistor MP2, the output current of the second cascode current mirror circuit is larger than the input current. When the current of transistor MP1 of the second differential pair is smaller than the current of transistor MP2, the output current of the second cascode current mirror circuit is smaller than the input current. The action that the output current of the second differential pair has upon the output current of the second cascode current mirror circuit at this time is the reverse of the action when the bias signals SB2 and SB2B are BN1 and VSS, respectively. Further, as for the currents of each of the transistors, the current of the PMOS transistors MP1 and MP2 is source-to-drain current, and the current of the NMOS transistors MN3 to MN8 is drain-to-source current.

A floating current source I3 is provided as a coupling stage (coupling circuit) that couples the input ends N15 and N25 of the first and second cascode current mirror circuits. The current of the floating current source I3 is the input current of the first and second cascode current mirror circuits. Connected between the output ends N16 and N26 of the first and second cascode current mirror circuits and the output terminal Vout of the differential amplifying circuit is an amplifying stage 2 for converting the output currents of the first and second cascode current mirror circuits to voltage and outputting the voltage to the output terminal Vout. The amplifying stage 2 charges the output terminal Vout when the output current of the first cascode current mirror circuit is smaller than the output current of the second cascode current mirror circuit, and discharges the output terminal Vout when the output current of the first cascode current mirror circuit is larger than the output current of the second cascode current mirror circuit.

Switches SW1, SW2, SW3 and SW4 are provided as an input changeover circuit for controlling the connections between the input terminal Vin and the output terminal Vout of the differential amplifying circuit and the gates of respective ones of the first and second differential pairs (MN1, MN2) and (MP1, MP2). Switch SW1 is connected between the input terminal Vin and the coupled gates of the transistors MN1 and MP1. Switch SW2 is connected between the input terminal Vin and the coupled gates of the transistors MN2 and MP2.

Switch SW3 is connected between the output terminal Vout and the coupled gates of the transistors MN2 and MP2. Switch SW4 is connected between the output terminal Vout and the coupled gates of the transistors MN1 and MP1.

FIG. 2 is a diagram useful in describing changeover control of switches and bias voltages in FIG. 1. FIG. 2 illustrates an example of ON/OFF control of switches SW1 to SW4 in FIG. 1 as well as control of the voltages of bias signals SB1, SB1B, SB2 and SB2B. Operation of this embodiment will be described with reference to FIGS. 1 and 2.

In a first time period (connection state 1), switches SW1, SW3 are turned on and switches SW2 and SW4 are turned off so that BP1, VDD, BN1 and VSS are supplied from SB1, SB1B, SB2 and SB2B, respectively, as bias voltages.

In the case of the first time period (connection state 1), the input terminal Vin is connected to the coupled gates of transistors MN1 and MP1 of FIG. 1 and a non-inverting input terminal is formed. The output terminal Vout is feedback-connected to the coupled gates of transistors MN2 and MP2 of FIG. 1 and an inverting input terminal is formed.

Further, in the first cascode current mirror circuit, the bias pair (MP5, MP6) is activated (turned on) and the bias pair (MP7, MP8) is deactivated (turned off). In the second cascode current mirror circuit, the bias pair (MN5, MN6) is activated (turned on) and the bias pair (MN7, MN8) is deactivated (turned off).

The first and second differential pairs (MN1, MN2) and (MP1, MP2) operate in accordance with the difference voltage between input terminal Vin and output terminal Vout, this is reflected in the output currents of the first and second cascode current mirror circuits and the output terminal Vout is charged or discharged by the amplifying stage 2. At this time the output current of transistor MN1 of the first differential pair connected to input terminal Vin is folded by transistor MP4 of the first cascode current mirror circuit and conveyed to the output current of the first cascode current mirror circuit via transistor MP6. Further, the output current of transistor MP1 of the second differential pair connected to the input terminal Vin is folded by transistor MN4 of the second cascode current mirror circuit and conveyed to the output current of the second cascode current mirror circuit via transistor MN6.

In a second time period (connection state 2), switches SW1 and SW3 are turned off and switches SW2 and SW4 are turned on so that BP1, VDD, BN1 and VSS are supplied from SB1B, SB1, SB2B and SB2, respectively, as bias voltages. In this case, the output terminal Vout is feedback-connected to the coupled gates of transistors MN1 and MP1 of FIG. 1 and an inverting input terminal is formed. The input terminal Vin is connected to the coupled gates of transistors MN2 and MP2 of FIG. 1 and a non-inverting input terminal is formed.

Further, in the first cascode current mirror circuit, the bias pair (MP7, MP8) is activated (turned on) and the bias pair (MP5, MP6) is deactivated (turned off). In the second cascode current mirror circuit, the bias pair (MN7, MN8) is activated (turned on) and the bias pair (MN5, MN6) is deactivated (turned off).

In connection state 2 as well, in a manner similar to that of connection state 1, the first and second differential pairs (MN1, MN2) and (MP1, MP2) operate in accordance with the difference voltage between the input terminal Vin and output terminal Vout, this is reflected in the output currents of the first and second cascode current mirror circuits and the output terminal Vout is charged or discharged by the amplifying stage 2. At this time, however, the current transmission paths of the differential pairs and cascode current mirror circuits are changed over. That is, the output current of transistor MN2 of the first differential pair connected to the input terminal Vin is folded by transistor MP3 of the first cascode current mirror circuit and conveyed to the output current of the first cascode current mirror circuit via transistor MP8. The output current of transistor MP2 of the second differential pair connected to the input terminal Vin is folded by transistor MN3 of the second cascode current mirror circuit and conveyed to the output current of the second cascode current mirror circuit via transistor MN8.

Thus, as described above, in the changeover between connection states 1 and 2 in the differential amplifying circuit of FIG. 1, the inverting and non-inverting input terminals of the first and second differential pairs are interchanged and so are the transmission paths of the output currents of the differential pairs and cascode current mirrors. However, in a case where the transistor pairs of the differential pairs, current mirror pairs and bias pairs are constituted by transistors of the same sizes, the differential amplifying circuit of FIG. 1 is such that the connection states 1 and 2 are equivalent and the operation of the circuit in these states is usually the same. When the voltages at the input terminal Vin and output terminal Vout are equal, the currents that flow into the transistors forming the pairs are equal to each other, and the input currents and output currents of the cascode current mirror circuits also are equal to each other. The output currents of the first and second cascode current mirror circuits also are equal to the floating current source I3, and the voltage at the output terminal Vout is stabilized.

Described next will be a case where an output offset is produced in the voltage at the output terminal Vout owing to the occurrence of a variation in the characteristics of the transistors in the differential amplifying circuit of FIG. 1.

By way of example, assume a case where the threshold-value voltage of transistor MN1 of the first differential pair is higher than usual. When the voltages at the input terminal Vin and the output terminal Vout are equal in connection state 1, the current that flows into transistor MN1 whose input end (gate) is connected to the input terminal Vin is smaller than the current that flows into transistor MN2. At this time the output current of the first cascode current mirror circuit is larger than the input current I3, as described above. On the other hand, the output current of the second cascode current mirror circuit is the same as the current value of the floating current source I3. Accordingly, the output current of the first cascode current mirror circuit is larger than the output current of the second cascode current mirror circuit and the output terminal Vout is discharged. The output terminal Vout is stabilized on the side of a potential that is lower than that of the voltage at input terminal Vin. That is, the differential amplifying circuit of FIG. 1 produces a minus offset owing to the variation in characteristics mentioned above.

On the other hand, when the threshold-value voltage of transistor MN1 of the first differential pair is higher than usual. When the voltages at the input terminal Vin and output terminal Vout are equal in connection state 2, the current that flows into transistor MN2 whose input end (gate) is connected to the input terminal Vin is larger than the current that flows into transistor MN1. At this time the output current of the first cascode current mirror circuit is larger than the input current I3, as described above. Accordingly, the output current of the first cascode current mirror circuit is smaller than the output current of the second cascode current mirror circuit and the output terminal Vout is charged. The output terminal Vout is stabilized on the side of a potential that is higher than that of the voltage at input terminal Vin. That is, the differential amplifying circuit of FIG. 1 produces a plus offset owing to the variation in characteristics mentioned above.

Figure 13:
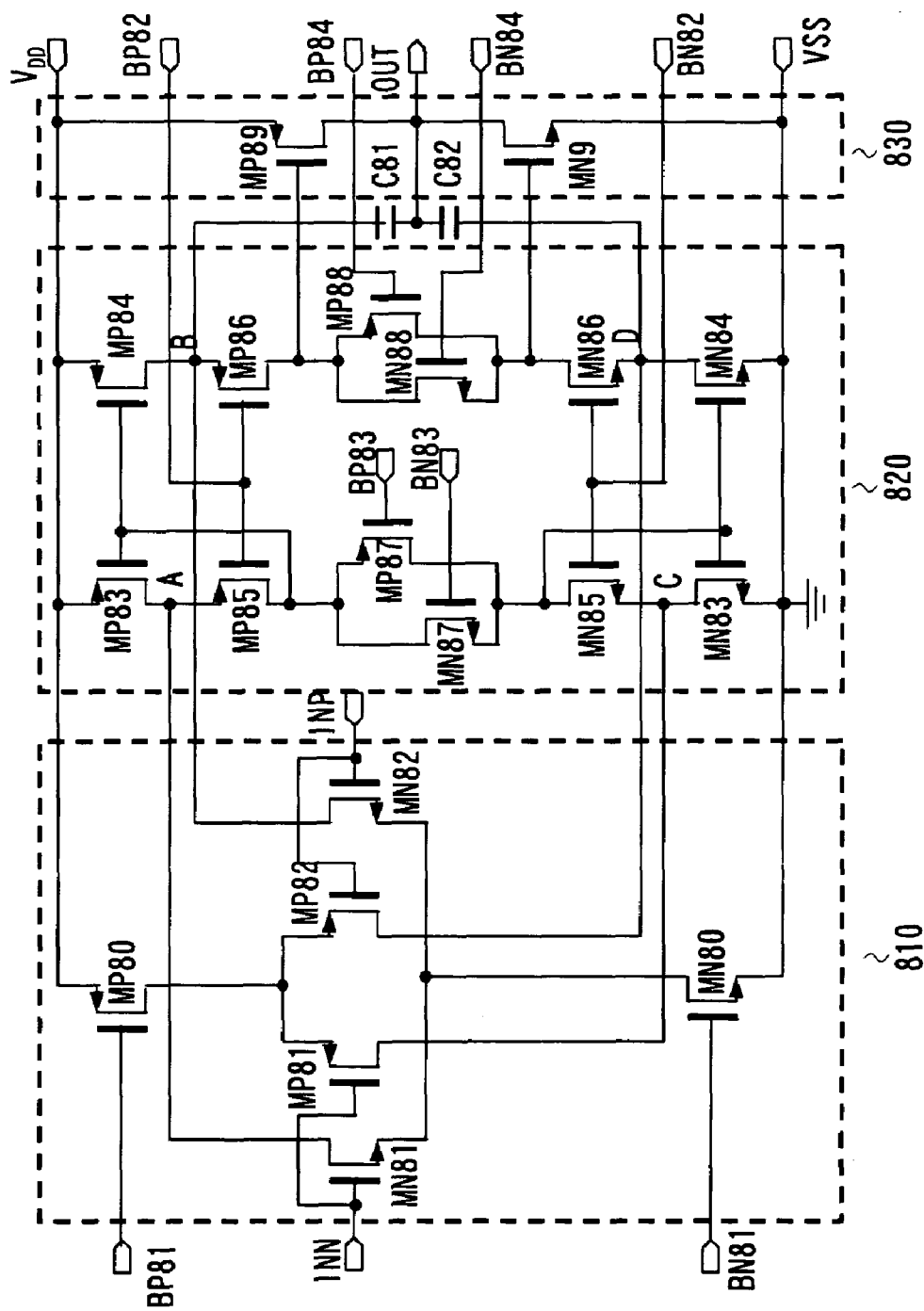
FIG. 13 is a diagram illustrating the configuration of a differential amplifying circuit according to Patent Document 2.

Thus, the polarities of the output offsets reverse and are the opposite of each other in connection states 1 and 2. By switching between connection states 1 and 2 periodically, the output offset is averaged and offset can be cancelled effectively in a manner similar to that described above with reference to FIGS. 13A and 13B.

The foregoing description relates to a variation in the threshold-value voltage of transistor MN1. However, offset can be cancelled similarly even in a case where characteristics exhibit variation in each transistor of the differential pairs and current mirror pairs.

It should be noted that the current sources I1, I2 and I3 and amplifying stage 2 that do not directly contribute to the relationship between the input and output currents of the current mirror circuits have almost no effect upon output offset even if there is a variation in characteristics. Further, there is almost no effect upon output offset even if a variation in characteristics occurs in the transistors of the bias pairs.

Figure 10A:
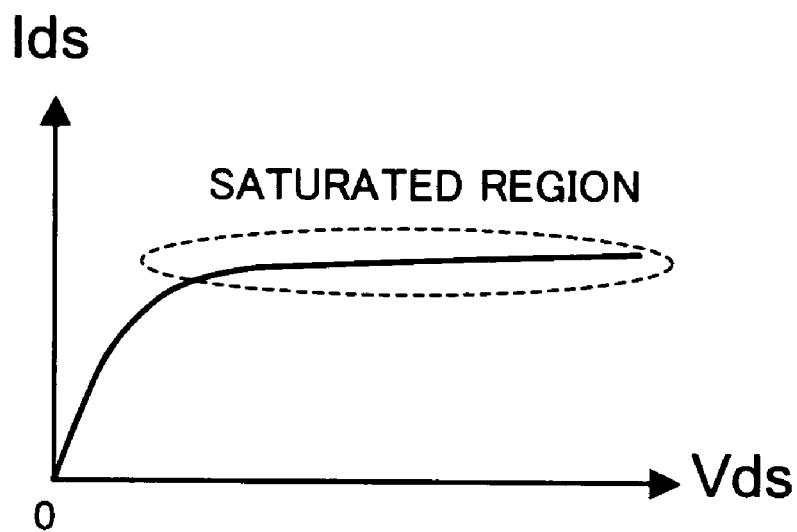
FIG. 10A is a diagram illustrating the voltage vs. current characteristic of a transistor.
Figure 10B:
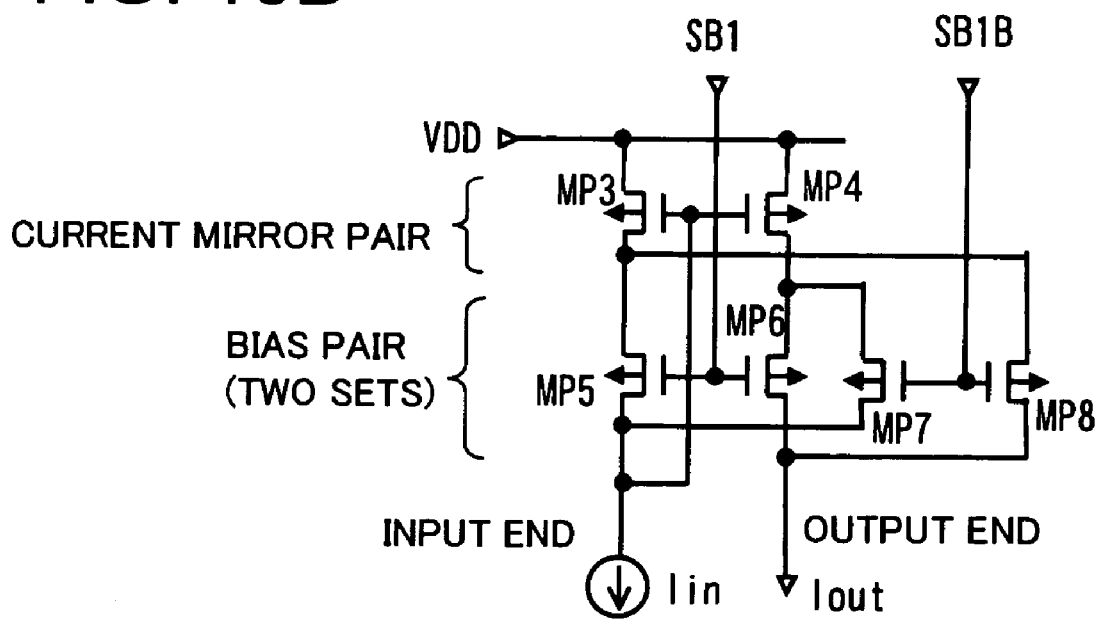
FIG. 10B is a diagram illustrating the configuration of a cascode current mirror.
Figure 11:
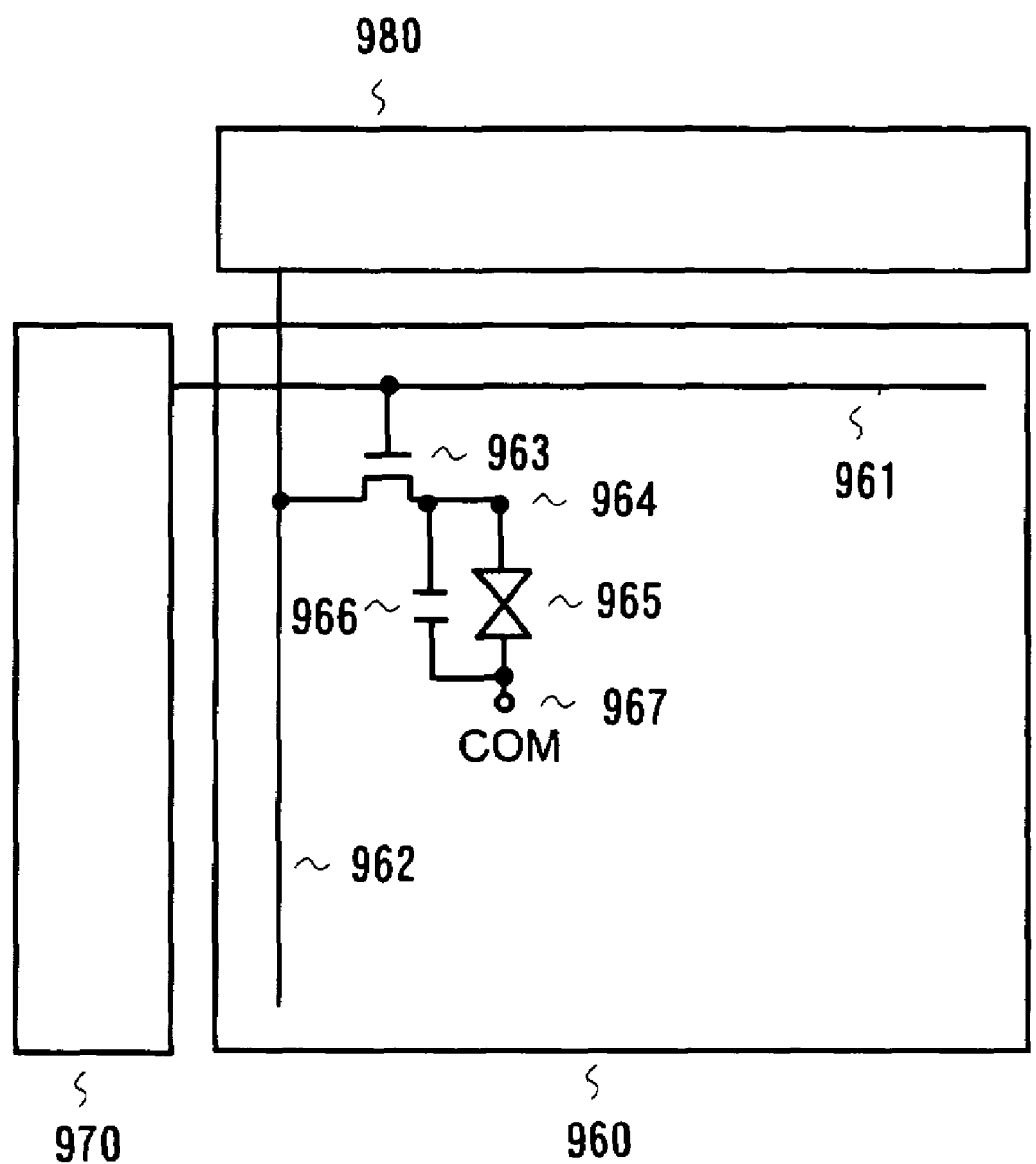
FIG. 11 is a diagram illustrating the configuration of a liquid crystal display device.
Figure 12A:
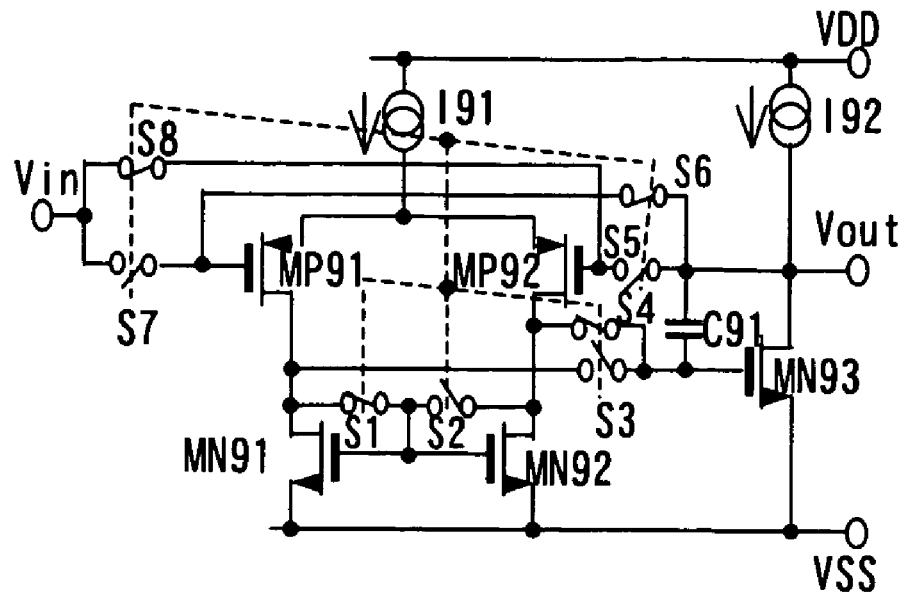
FIGS. 12A and 12B are diagram illustrating the configuration of the conventional art.
Figure 12B:
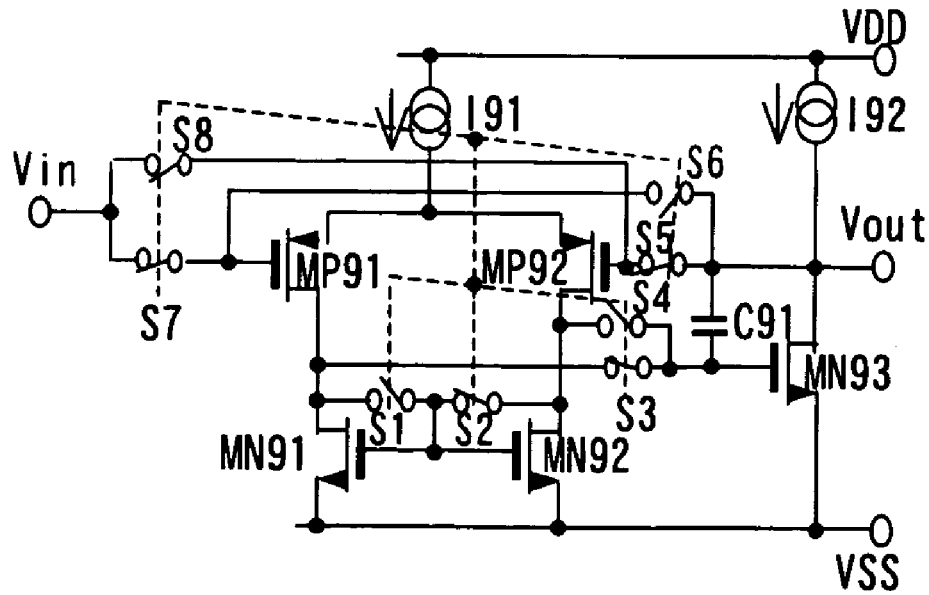

The reason why a variation in the characteristics of the transistors of the bias pairs has almost no effect upon output offset will be described with reference to FIGS. 10A and 10B. FIG. 10A is a diagram illustrating the Ids-Vd characteristic of a transistor, and FIG. 10B is a diagram illustrating the first cascode current mirror circuit and a current source Iin, which supplies this current mirror circuit with input current, in the differential amplifying circuit of FIG. 1. In FIG. 10B, the cascode current mirror circuit has the current mirror pairs (MP3, MP4) and two bias pairs (MP5), (MP6) and (MP7, MP8), in which the transistors forming the respective pairs have identical sizes. Further, each transistor is designed so as to operate in the saturated region.

If a variation in characteristics (e.g., a variation in threshold-value voltage) develops between the transistors of the transistor pair (MP3, MP4), the fact that the transistors MP3 and MP4 have their gates coupled together and their sources coupled together means the variation in characteristics directly becomes a current difference between the transistors MP3 and MP4, as a result of which a deviation develops between the input current and output current of the cascode current mirror circuit. On the other hand, assume that the transistor pair (MP5, MP6) has been activated (turned on) and the bias pair (MP7, MP8) deactivated (turned off) by the bias signals SB1 and SB1B. If a variation in characteristics (e.g., a variation in threshold-value voltage) develops between the transistors of the bias pair (MP5, MP6), it is possible for the sources of the transistors MP5 and MP6 to take on different potentials although the gates of the transistors MP3 and MP4 have been coupled together. The source of transistor MP5 is connected to the drain (N14) of transistor MP3, and the source of transistor MP6 is connected to the drain (N13) of transistor MP4.

When the transistor operates in the saturated region, as illustrated in FIG. 10A, a change in the drain-to-source current is sufficiently small even if there is some change in drain-to-source voltage Vds. That is, in a case where there is no variation in the characteristics of the current mirror pair (MP3, MP4) and the currents of the transistors MP3 and MP4 are equal to each other, mutually equal currents can also be passed through bias pair (MP5, MP6), in which a variation in characteristics has occurred, by a small shift in the potentials at nodes N13 and N14.

That is, a variation in characteristics between the transistors of the bias pair (MP5, MP6) has almost no effect upon the relationship between the input and output characteristics of the cascode current mirror circuit. Similarly, if, when the bias pair (MP7, MP8) is activated, a variation in characteristics occurs between transistors of the bias pair (MP7, MP8), the variation has almost no effect upon the relationship between the input and output currents of the cascode current mirror circuit.

In the differential amplifying circuit of FIG. 1, the first cascode current mirror circuit is a folded cascode current mirror circuit in which the output current of a differential pair is folded. However, the action of the bias pair described with reference to FIG. 10B is the same. That is, even if a variation in characteristics occurs between transistors of the bias pair, the variation has almost no effect upon the relationship between the input and output currents of the first and second cascode current mirror circuits. There is no effect, therefore, upon output offset.

Thus, the differential amplifying circuit of FIG. 1 is such that in the changeover between connection state 1 and connection state 2, the changeover is implemented through a simple arrangement owing to the interchange of the non-inverting input terminal and inverting input terminal and the changeover between the straight- and cross-connections of the two bias pairs connected between the input end and the output end of the cascode current mirror circuit. In addition, with regard to a variation in the characteristics of the transistors that construct the differential amplifying circuit, output offset can be cancelled effectively by changing over between connection states 1 and 2 periodically. It should be noted that the arrangement in which bias pairs that have sufficiently little influence upon output offset with respect to a variation in transistor characteristics are utilized in changeover is one important feature of the present invention.

Figure 3:
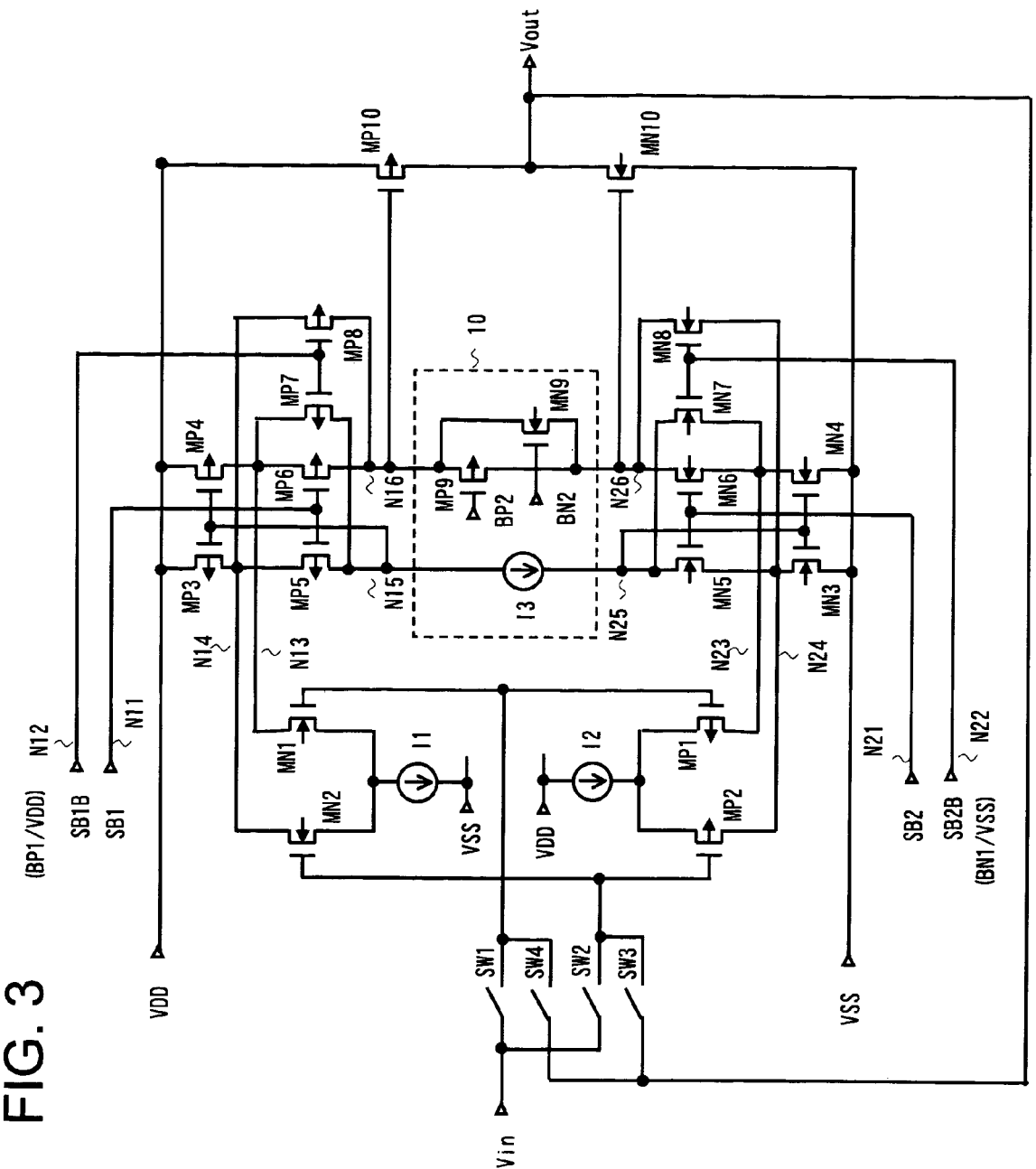
FIG. 3 is a diagram illustrating the specific structure of the first embodiment.

FIG. 3 is a diagram illustrating an example of the configuration of the embodiment shown in FIG. 1. As shown in FIG. 3, the amplifying stage 2 includes a PMOS transistor MP10 (an output transistor for driving the charging of the output terminal) having a source connected to the power supply VDD on the high potential side, a gate connected to terminal N16 and a drain connected to the output terminal Vout; and an NMOS transistor MN10 (an output transistor for driving the discharging of the output terminal) having a source connected to the power supply VSS on the low potential side, a gate connected to terminal N26 and a drain connected to the output terminal Vout.

Further, provided between the output terminals N16 and N26 of the first and second cascode current mirror circuits are a PMOS transistor MP9 having a source connected to terminal N16, a gate to which the bias voltage BP2 is input and a drain connected to terminal N26; and an NMOS transistor MN9 having a drain connected to terminal N16, a gate to which the bias voltage BN2 is input and a source connected to terminal N26. The PMOS transistor MP9, NMOS transistor MN9 and current source I3 each form a floating current source and compose the coupling stage 10 that couples two differential pairs (MN1, MN2) and (MP1, MP2) via the first and second cascade current mirror circuits. When the output current of the first cascode current mirror is smaller than the output current of the second cascode current mirror, the floating current sources MP9 and MN9 pull down the potentials of terminals N16 and N26, so that the output terminal Vout is charged by the output transistor MP10. Further, when the output current of the first cascode current mirror is larger than the output current of the second cascode current mirror, the floating current sources MP9 and MN9 pull up the potentials of terminals N16 and N26, so that the output terminal Vout is discharged by the output transistor MN10.

Figure 4:
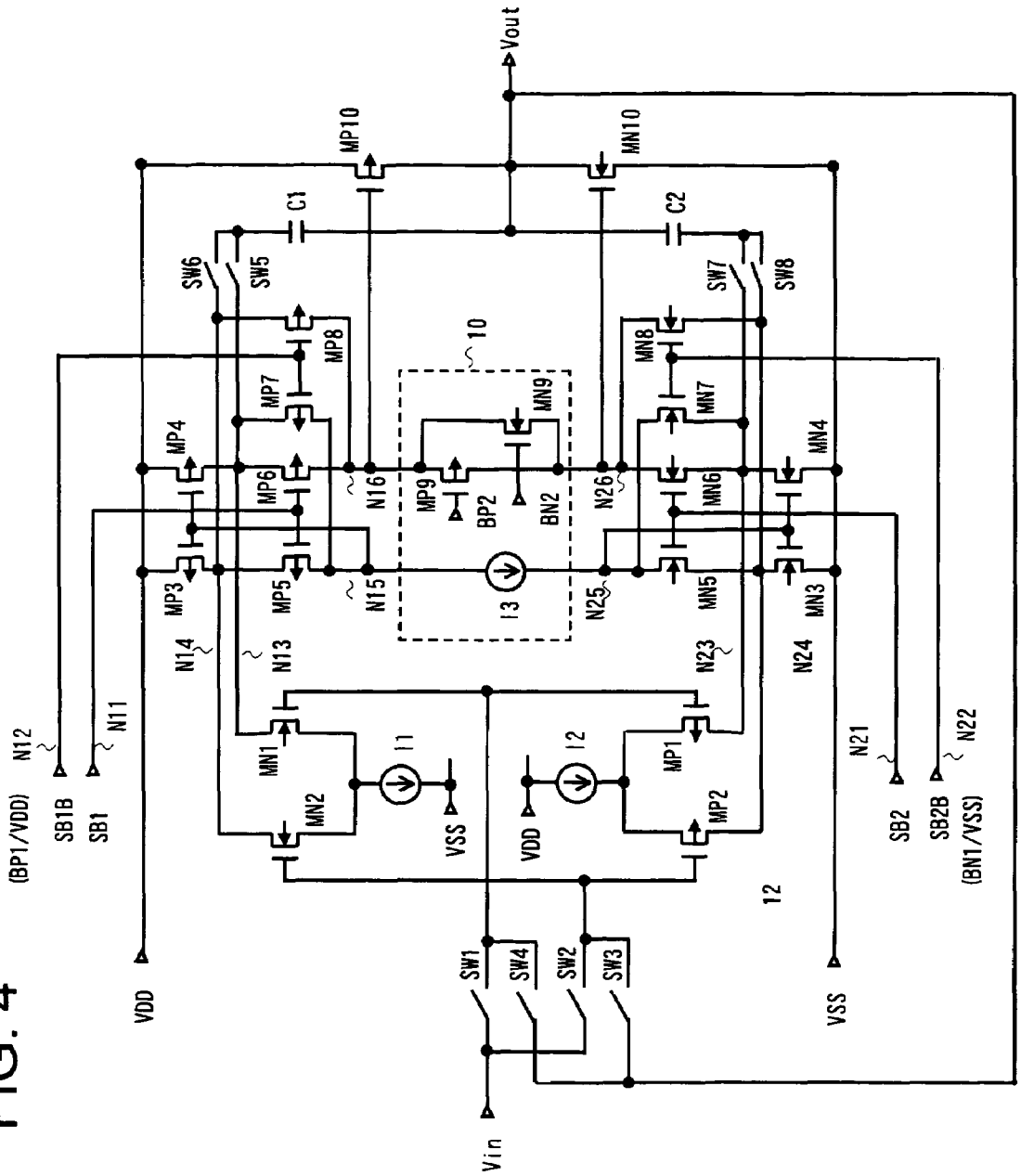
FIG. 4 is a diagram illustrating another example of the specific structure of the first embodiment.

FIG. 4 is a diagram illustrating a modification of the first embodiment. As shown FIG. 4, this differential amplifying circuit adds phase compensating capacitors C1 and C2 to the implementation of FIG. 1, controls the connection of the capacitor C1 by switches SW5 and SW6, and controls the connection of the capacitor C2 by switches SW7 and SW8. In this differential amplifying circuit constituting a voltage follower, the phase compensating capacitors C1 and C2 are preferably connected between the output terminal Vout and a terminal on the current transmission path of the transistor on the non-inverting input side of the differential pair that converts the input signal Vin to a current output. In FIG. 4, the capacitor C1 has a first end connected to the output terminal Vout and a second end connected to the terminals N13 and N14 via the switches SW5 and SW6, respectively. The capacitor C2 has a first end connected to the output terminal Vout and a second end connected to the terminals N23 and N24 via the switches SW7 and SW8, respectively.

The switches SW5, SW6, SW7 and SW8 are subjected to the same ON/OFF control as the switches SW1, SW2, SW3 and SW4 shown in FIG. 2.

In connection state 1, switches SW1 and SW3 are turned on so that the coupled gates of transistors MN1 and MP1 become the non-inverting input terminal and the coupled gates of transistors MN2 and MP2 become the inverting input terminal. In the first cascode current mirror circuit, the bias signal SB1 is made the voltage BP1, the bias pair (MP5, MP6) is activated and the PMOS transistor MP4 folds the current of the transistor MN1 on the non-inverting input side and transmits it to the output end (N16) of the first cascode current mirror circuit. Therefore, in order for capacitor C1 to be connected between the output terminal Vout and the drain (N13) of PMOS transistor MP4, switches SW5 and SW6 are turned on and off, respectively. Further, in the second cascode current mirror circuit, the bias signal SB2 is made the voltage BN1, the bias pair (MN5, MN6) is activated and the NMOS transistor MN4 folds the current of the transistor MP1 on the non-inverting input side and transmits it to the output end (N26) of the second cascode current mirror circuit. Therefore, in order for capacitor C2 to be connected between the output terminal Vout and the drain (N23) of NMOS transistor MN4, switches SW7 and SW8 are turned on and off, respectively.

In connection state 2, switches SW2 and SW4 are turned on so that the coupled gates of transistors MN1 and MP1 become the inverting input terminal and the coupled gates of transistors MN2 and MP2 become the non-inverting input terminal. In the first cascode current mirror circuit, the bias signal SB1B is made the voltage BP1, the bias pair (MP7, MP8) is activated and the PMOS transistor MP3 folds the current of the transistor MN2 on the non-inverting input side and transmits it to the output end (N16) of the first cascode current mirror circuit. Therefore, in order for capacitor C1 to be connected between the output terminal Vout and the drain (N14) of PMOS transistor MP3, switches SW6 and SW5 are turned on and off, respectively. Further, in the second cascode current mirror circuit, the bias signal SB2B is made the voltage BN1, the bias pair (MN7, MN8) is activated and the NMOS transistor MN3 folds the current of the transistor MP2 on the non-inverting input side and transmits it to the output end (N26) of the second cascode current mirror circuit. Therefore, in order for capacitor C2 to be connected between the output terminal Vout and the drain (N24) of NMOS transistor MN3, switches SW8 and SW7 are turned on and off, respectively.

It should be noted that an arrangement in which capacitor C1 is provided between the gate (N16) of output transistor MP10 and the output terminal and capacitor C2 is provided between the gate (N26) of output transistor MN10 and the output terminal may be adopted as a connection arrangement of the phase compensating capacitors C1, C2 that differs from that shown in FIG. 4.

Figure 5:
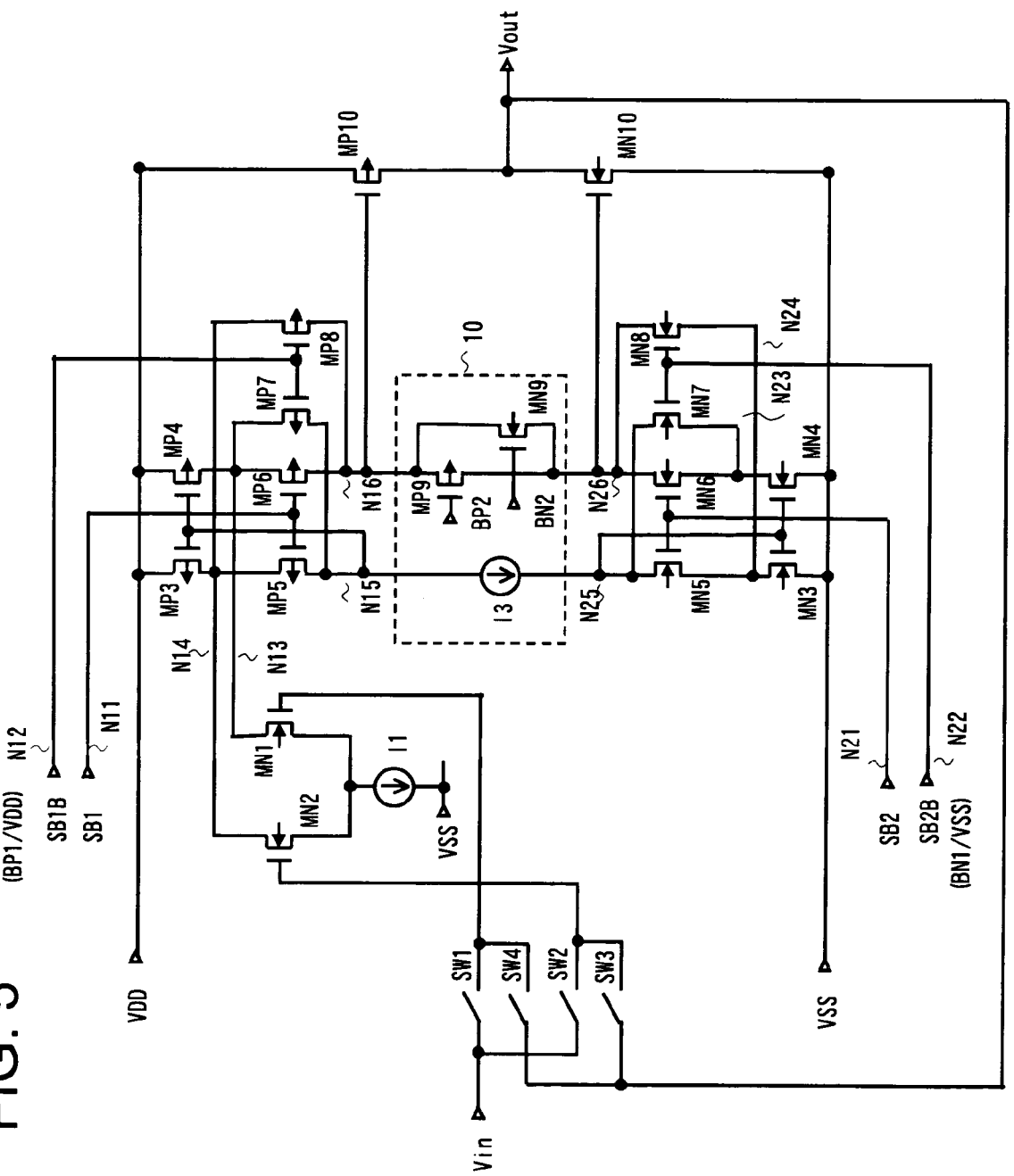
FIG. 5 is a diagram illustrating the configuration of a second embodiment according to the present invention.

FIG. 5 is a diagram illustrating the configuration of another embodiment of the present invention. As shown in FIG. 5, this embodiment is devoid of the second differential pair (MP1, MP2) and current source I2 and includes one differential pair, namely the first differential pair (MN1, MN2), and the current source I1. The configurations of the first cascode current mirror circuit (MP3, MP4, MP5, MP6, MP7, MP8), the second cascode current mirror circuit (MN3, MN4, MN5, MN6, MN7, MN8) and the coupling stage 10 (I3, MP9, MN9) that couples the input ends and couples the output ends of the first and second cascode current mirror circuits are the same as shown of the first embodiment depicted in FIG. 3. Further, the configuration of the amplifying stage MP10 and MN10 is the same as that of the first embodiment shown in FIG. 3.

The differential amplifying circuit of FIG. 3 is provided with the first and second differential pairs, the input terminal Vin and output terminal Vout are connected to the non-inverting input and inverting input, respectively, of respective ones of the first and second differential pairs, and the output currents of the respective differential pairs act upon the output currents of the first and second cascode current mirrors. When the output current of the first cascode current mirror increases or decreases, a counteraction in which the output current of the second cascode current mirror decreases or increases is produced to thereby control the charging and discharging of the output transistors MP10 and MN10.

By contrast, the differential amplifying circuit of FIG. 5 is such that the input terminal Vin and output terminal Vout are connected to the non-inverting input and inverting input, respectively, of the first differential pair (MN1, MN2), and the output current of the first differential pair acts upon the output current of the first cascode current mirror. Since the input current of the second cascode current mirror is the current source I3 shared by the first cascode current mirror, the output current of the second cascode current mirror is the mirror current of the current source I3, and the output transistors MP10, MN10 operate in accordance with the current difference between this mirror current and the output current of the first cascode current mirror.

Accordingly, the differential amplifying circuit operates normally even with an arrangement in which it is provided with only one of the first and second differential pairs, as illustrated in FIG. 5. By controlling the bias signals SB1, SB1B, SB2 and SB2B and switches SW1 to SW4 in a manner the same as that shown in FIG. 2, it is possible to effectively cancel output offset ascribable to a variation in transistor characteristics in a manner similar to that of the differential amplifying circuit shown in FIG. 3.

Figure 6:
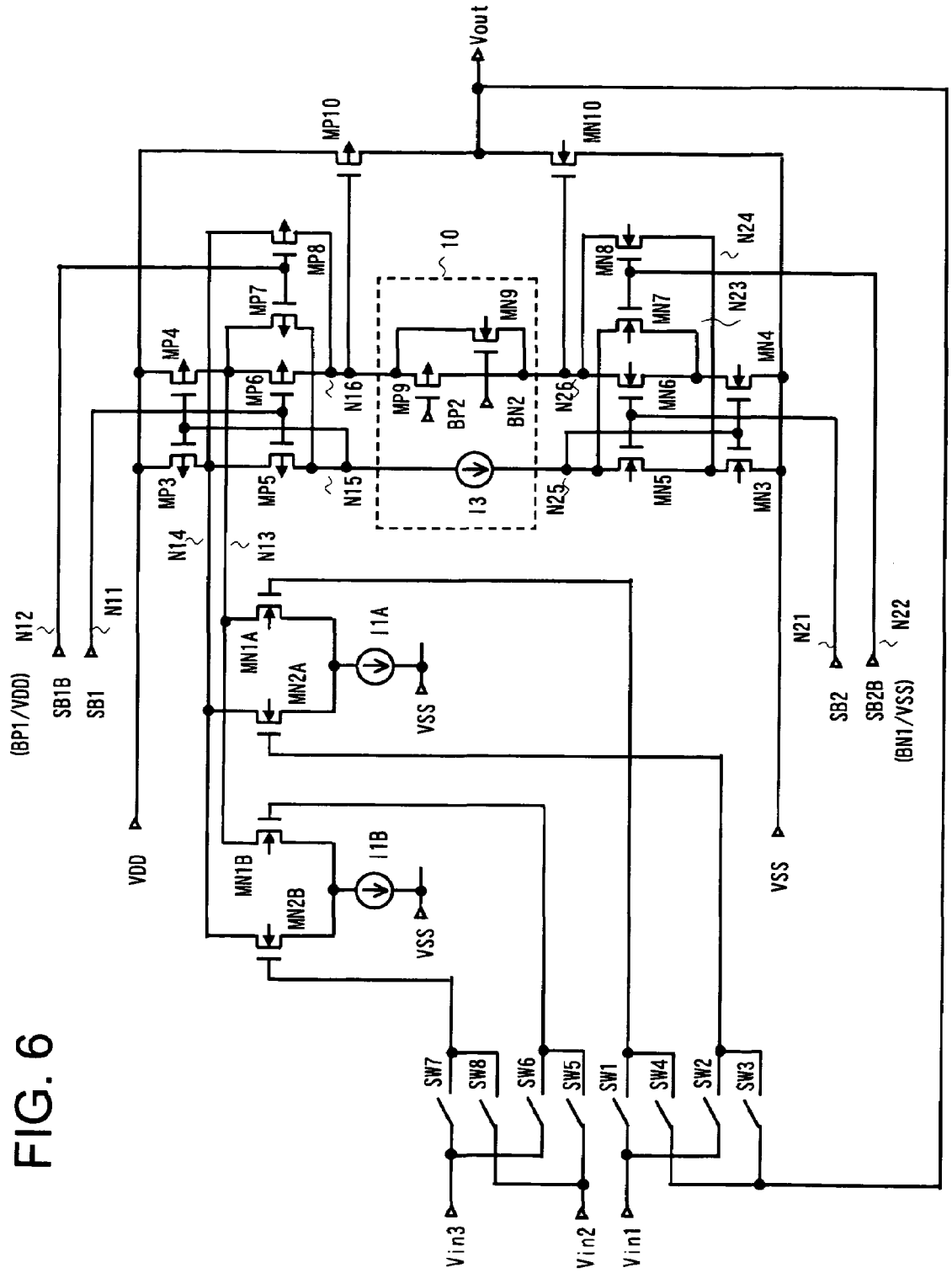
FIG. 6 is a diagram illustrating the configuration of a modification of the second embodiment.

FIG. 6 is a diagram illustrating an implementation in a case where a plurality of differential pairs of identical polarity (conductivity type) are provided in parallel compared with FIG. 5. The configurations of the first cascode current mirror circuit (MP3, MP4, MP5, MP6, MP7, MP8), the second cascode current mirror circuit (MN3, MN4, MN5, MN6, MN7, MN8) and the coupling stage 10 (I3, MP9, MN9) that couples the input ends and couples the output ends of the first and second cascode current mirror circuits are the same as shown of the first embodiment depicted in FIG. 3. Further, the configuration of the amplifying stage MP10 and MN10 is the same as that of the first embodiment shown in FIG. 3.

The input differential stage includes source-coupled NMOS transistors MN1A and MN2A constituting a first differential pair; source-coupled NMOS transistors MN1B and MN2B constituting a second differential pair; a constant current source I1A connected between the coupled sources of the NMOS transistors MN1A and MN2A, which form the first differential pair, and the power supply VSS on the low-potential side; and a constant current source I1B connected between the coupled sources of the NMOS transistors MN1B and MN2B, which form the second differential pair, and the power supply VSS on the low-potential side. The drains of the NMOS transistors MN1A and MN2A that form the first differential pair are connected to the drains of the NMOS transistors MN1B and MN2B, respectively, which form the second differential pair, and to node N13 at which MP4 and MP6 are connected and node N14 at which MP3 and MP5 are connected, respectively. The current sources I1A and I1B may be made a single common current source.

Switches SW1, SW2, SW3, SW4, SW5, SW6, SW7 and SW8 are provided as an input changeover circuit that controls the connections between the input terminals Vin1, Vin2 and Vin3 and output terminal Vout of the differential amplifying circuit and the gates of respective ones of the first and second differential pairs (MN1A, MN2A) and (MN1B, BN2B).

The switches SW1 and SW4 are connected between the gate of NMOS transistor MN1A and the input terminal Vin1 and the output terminal Vout, respectively.

The switches SW2 and SW3 are connected between the gate of NMOS transistor MN2A and the input terminal Vin1 and the output terminal Vout, respectively.

The switches SW5 and SW6 are connected between the gate of NMOS transistor MN1B and the input terminals Vin2 and Vin3, respectively.

The switches SW7 and SW8 are connected between the gate of NMOS transistor MN2B and the input terminals Vin3 and Vin2, respectively.

FIG. 6 illustrates the arrangement of two differential pairs of the same polarity for the sake of simplicity. It should be noted that a variety of differential amplifiers having multiple differential pairs have been proposed. Patent Document 3 [Japanese Patent Kokai Publication No. 2001-34234 (FIG.

5)] and Patent Document 4 [Japanese Patent Kokai Publication No. 2002-43944 (FIGS. 2 and 3)] disclose arrangements in which the inverting input terminals of a plurality of differential pairs are all feedback-connected to an output terminal. Patent Document 5 [Japanese Patent Kokai Publication No. 2005-130332 (FIGS. 1 and 26)] discloses an arrangement in which one of the inverting input terminals of a plurality of differential pairs is feedback-connected and the others are supplied with prescribed signals. Disclosed in FIG. 7, etc., of Patent Document 5 are an arrangement in which three differential pairs are provided in parallel and the current mirror of a load circuit is shared, as well as an extrapolating amplifier having two signal inputs (corresponding to Vin2=Vin3). FIG. 6 of the present invention illustrates an expansion to a differential amplifying circuit obtained by adding a differential pair to the differential amplifying circuit of FIG. 5. That is, this differential amplifying circuit has two differential pairs of the same polarity that share the same load circuit. Further, a differential amplifying circuit having three or more differential pairs of the same polarity may be obtained by performing an expansion similar to that shown in FIG. 6.

How the differential inputs of the plurality of parallel-connected differential pairs are connected is important. Any desired arrangement may be adopted for the amplifying stage itself.

The circuit arrangement shown in FIG. 6 is a differential amplifying circuit having a plurality of parallel-connected differential pairs and including cascode current mirrors that receive output currents of the plurality of differential pairs. Positive output offset and negative output offset can be averaged (canceled) and the accuracy of output voltage improved through a simple arrangement.

FIG. 7 is a diagram illustrating the setting of switches SW1 to SW8 and bias signals SB1, SB1B, SB2 and SB2B in FIG. 6.

In a first time period (connection state 1), switches SW1, SW3, SW5 and SW7 are turned on and switches SW2, SW4, SW6 and SW8 are turned off. At this time the gates of transistors MN1A and MN2A of the first differential pair are connected to the input terminal Vin and output terminal Vout, respectively. Further, the gates of transistors MN1B and MN2B of the second differential pair are connected to input terminals Vin2 and Vin3. The bias signal SB1 is made BP1, the complementary bias signal SB1B is made the power supply VDD on the high potential side, the bias signal SB2 is made BN1, and the complementary bias signal SB2B is made the power supply VSS on the low potential side. The bias pairs (MP5, MP6) and (MN5, MN6) are activated at this time. The inputs (gates) of the input pair of the differential pair (MN1A, MN2A) become non-inverting and inverting input terminals, respectively, Vin1 and Vout are input thereto, and Vin2 and Vin3 are input to the gates of the differential pair (MN1B, MN2B), respectively. Since the output pair of the differential pair (MN1A, MN2A) and the output pair of the differential pair (MN1B, MN2B) are connected together, the output currents of the respective differential pairs are combined and act upon the output current of the first cascode current mirror. In a case where each of the transistors of the two differential pairs (MN1A, MN2A) and (MN1B, MN2B) are of the same size, feedback control is performed in such a manner that a difference voltage (Vin1−Vout) between the voltage Vin1 at the non-inverting input terminal and voltage Vout at the inverting input terminal of the differential pair (MN1A, MN2A) will become equal to the absolute value of the difference voltage (Vin2−Vin3) of the differential pair (MN1B, MN2B), though of the opposite sign. As a result, an output voltage $$Vout=Vin1+Vin2-Vin3$$

is obtained.

In a second time period (connection state 2), switches SW1, SW3, SW5 and SW7 are turned off and switches SW2, SW4, SW6 and SW8 are turned on. At this time the inputs (gates) of the input pair of the first differential pair (MN1A, MN2A) are changed over from the first time period (connection state 1) and become inverting and non-inverting input terminals, respectively, which are connected to output terminal Vout and input terminal Vin1, respectively. The inputs (gates) of the input pair of the second differential pair (MN1B, MN2B) are connected to input terminals Vin3 and Vin2, respectively. The bias signal SB1 is made the power supply VDD on the high potential side, the complementary bias signal SB1B is made BP1, the bias signal SB2 is made the power supply VSS on the low potential side, the complementary bias signal SB2B is made BN1 and the bias pairs (MP7, MP8) and (MN7, MN8) are activated. In this case, an output voltage $$Vout=Vin1+Vin2-Vin3$$

is output at the output terminal Vout in a manner similar to that in connection state 1.

By switching between connection states 1 and 2 periodically, the inverting and non-inverting input terminals of the first and second differential pairs are interchanged and the transmission paths of the output currents of the differential pairs and cascode current mirror circuits are changed over. As a result, output offset can be cancelled effectively with regard to a variance in transistor characteristics.

In connection states 1 and 2, the output-terminal voltage Vout is made Vin1+Vin2−Vin3.

If we assume that Vin1=Vin2 holds in FIG. 6, then Vout will be a voltage (2Vin1−Vin3) that externally divides Vin1 and Vin3, as described in Patent Document 5.

If we assume that Vin3=Vout holds, then Vout can be made a voltage [(Vin1+Vin2)/2] that internally divides Vin1 and Vin2, as described in Patent Document 3.

FIG. 8A is a diagram illustrating the configuration of a circuit for generating bias signals SB2 and SB2B, and FIG. 8B is a diagram illustrating the configuration of a circuit for generating bias signals SB1 and SB1B. FIG. 8C is a diagram illustrating control for changing over the switches.

In connection state 1, switches SW11, SW13, SW15 and SW17 are turned on, BP1 and BN1 are supplied as the bias signals SB1 and SB2, respectively, and VDD and VSS are supplied as SB1B and SB2B, respectively.

In connection state 2, switches SW12, SW14, SW16 and SW18 are turned on, BP1 and BN1 are supplied as the bias signals SB1B and SB2B, respectively, and VDD and VSS are supplied as SB1 and SB2m respectively. FIGS. 8A and 8B are capable of being shared by a plurality of differential amplifying circuits, as a matter of course.

Figure 9:
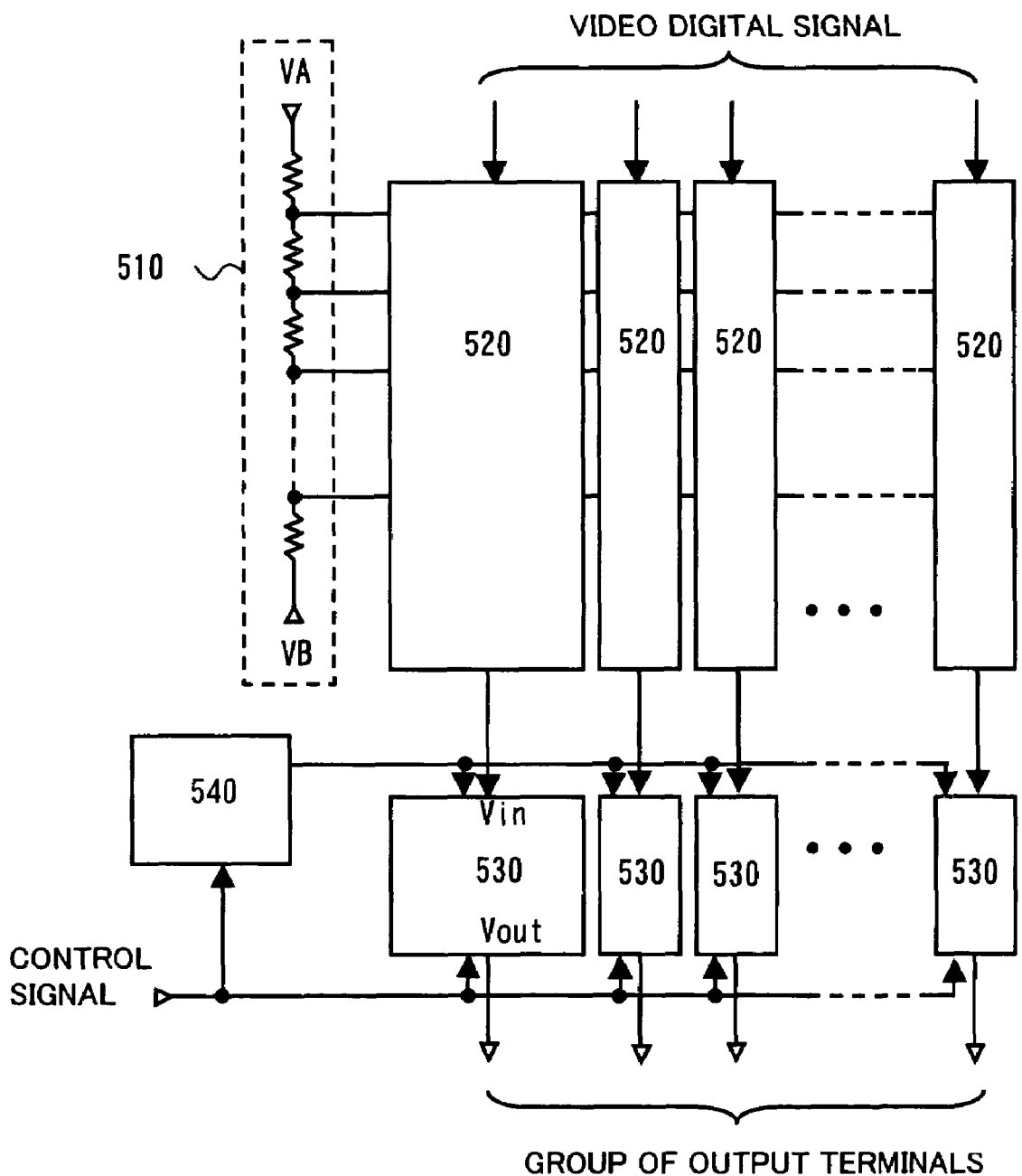
FIG. 9 is a diagram useful in describing the configuration of a driver circuit according to the present invention.

FIG. 9 is a diagram illustrating the configuration of a driver according to another embodiment of the present invention. This illustrates the configuration of a data driver that drives the data lines of a display unit such as a liquid crystal panel based upon a video signal. As shown in FIG. 9, the data driver includes a grayscale voltage generating circuit 510, a plurality of decoders (selecting circuits) 520, a plurality of buffer circuits (driver circuits) 530 and a bias voltage control circuit 540 (see FIG. 8) for controlling changeover of bias voltage based upon a control signal.

The grayscale voltage generating circuit 510 comprises a resistor string connected between voltages VA and VB. Grayscale voltages (reference voltages) necessary for a grayscale output are output from the taps of the resistor string.

Grayscale voltages that have been output from the grayscale voltage generating circuit 510 and a digital video signal are input to the decoders 520. The decoders 520 select grayscale voltages conforming to the video digital signal and output the selected grayscale voltages to input terminals Vin (input terminals Vin1, Vin2, Vin3) of the buffer circuits 530.

Each buffer circuit 530 comprises the differential amplifying circuit (constituting a voltage-follower-type) of any of the embodiments described with reference to FIGS. 1 to 7. The voltage signals supplied to the input pairs of the differential pairs are changed over by a control signal that is input to the buffer circuit. The control signal input to the control driver controls the ON/OFF action of the switches of the input changeover circuit of each differential amplifying circuit (buffer circuit 530) and controls the ON/OFF action of the switches of the bias voltage control circuit 540 so that bias signals input to each of the differential amplifying circuit are generated. The control signal is made a signal such that the connection states 1 and 2 are changed over alternatingly in the manner illustrated in FIG. 8C. The output of each buffer circuit 530 is connected to a data line of the display unit.

The decoder 520 and buffer circuit 530 are provided for every data line, and all of the outputs of the grayscale voltage generating circuit 510 are shared. Further, a digital signal that has been processed by a data register, latch and level shifter (none of which are shown), etc., is input as the video digital signal applied to the decoders 520.

FIG. 10A is a diagram illustrating the Ids-Vd characteristic of a transistor, and FIG. 10B is a diagram illustrating an example of the configuration of a cascode current mirror according to the present invention. The present invention makes it possible to achieve an averaged, highly accurate current output with regard to a variation in transistor characteristics by control of the bias signals SB1 and SB1B not only in a differential amplifying circuit having a cascode current mirror but also in a discrete cascode current mirror. As described with reference to FIGS. 10A and 10B, even in a case where the transistors MP5 to MP8 develop a variation in characteristics, there is no effect upon the relationship between the input current and output current of the cascode current mirror, and a current difference is produced between the input current and output current of the cascode current mirror owing solely to a variation in characteristics between the transistors of the current mirror pair (MP3, MP4). In the cascode current mirror of the present invention, however, the active state and inactive state of the bias pairs (MP5, MP6) and (MP7, MP8) are selected alternatively by the bias signals SB1 and SB1B. As a result, the input side and output side of the current mirror pair (MP3, MP4) are interchanged and the offset current of the output current of the cascode current mirror is reversed in polarity. By repeating this changeover periodically, an averaged (cancelled-offset), highly accurate output current can be obtained.

Though the present invention has been described in accordance with the foregoing embodiments, the invention is not limited to this embodiment and it goes without saying that the invention covers various modifications and changes that would be obvious to those skilled in the art within the scope of the claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A differential amplifying circuit comprising:
at least one differential pair of transistors; and
a load circuit connected to said differential pair,
said load circuit comprising a cascode current mirror circuit that includes:
a first transistor pair;
a second transistor pair straight-connected in cascade fashion between said first transistor pair and an input end and an output end of said cascode current mirror circuit; and
a third transistor pair cross-connected in cascade fashion between said first transistor pair and the input end and the output end of said cascode current mirror circuit;
said second and third transistor pairs being controlled so as to each be placed in active and inactive states by changing over voltage values of first and second bias signals applied thereto respectively, with control being exercised in such a manner that when one of said second and third transistor pairs is in an active state, the other is in an inactive state.

2. The circuit according to claim 1, wherein said first transistor pair includes first and second transistors having first signal terminals connected in common with a first power supply and having control terminals coupled together;
said second transistor pair includes third and fourth transistors having first signal terminals connected to second signal terminals of said first and second transistors, respectively, and having control terminals coupled together;
said third transistor pair includes fifth and sixth transistors having first signal terminals connected to the second signal terminals of said second and first transistors, respectively, and having control terminals coupled together;
second signal terminals of said third and fifth transistors are coupled together, form the input end of said cascode current mirror circuit, and are connected to the coupled control terminals of said first and second transistors;
second signal terminals of said fourth and sixth transistors are coupled together and form the output end of said cascode current mirror circuit;
said first bias signal having a voltage value capable of being changed over is connected to the coupled control terminals of said third and fourth transistors; and;
said second bias signal having a voltage value capable of being changed over is connected to the coupled control terminals of said fifth and sixth transistors.

3. The circuit according to claim 2, wherein a pair of outputs of said differential pair are connected to a connection node at which the second signal terminal of said first transistor and the first signal terminals of each of said third and sixth transistors are connected together, and a connection node at which the second signal terminal of said second transistor and the first signal terminals of each of the fourth and fifth transistors are connected together, respectively.

4. The circuit according to claim 1, further comprising another cascode current mirror circuit having a conductivity type opposite that of said cascode current mirror circuit, said another cascode current mirror circuit arranged between first and second power supplies in opposition to said cascode current mirror circuit;
wherein said another cascode current mirror circuit includes:
a fourth transistor pair;

a fifth transistor pair straight-connected between said fourth transistor pair and an input end and an output end of said another cascode current mirror circuit; and a sixth transistor pair cross-connected between said fourth transistor pair and the input end and the output end of said other cascode current mirror circuit;

said fifth and sixth transistor pairs being controlled so as to each be placed in active and inactive states by changing over voltage values of third and fourth bias signals applied thereto respectively, with control being exercised in such a manner that when one of said fifth and sixth transistor pairs in an active state, the other is in an inactive state.

5. The circuit according to claim 4, wherein said fourth transistor pair includes seventh and eighth transistors having first signal terminals connected in common with the second power supply and having control terminals coupled together;

said fifth transistor pair includes ninth and tenth transistors having first signal terminals connected to second signal terminals of said seventh and eighth transistors, respectively, and having control terminals coupled together;

said sixth transistor pair includes 11th and 12th transistors having first signal terminals connected to the second signal terminals of said eight and seventh transistors, respectively, and having control terminals coupled together;

second signal terminals of said ninth and 11th transistors are coupled together, form the input end of said other cascode current mirror circuit, and are connected to the coupled control terminals of said seventh and eighth transistors;

second signal terminals of said tenth and 12th transistors are coupled together and form the output end of said other cascode current mirror circuit;

said third bias signal having a voltage value capable of being changed over is connected to the coupled control terminals of said ninth and tenth transistors; and;

said fourth bias signal having a voltage value capable of being changed over is connected to the coupled control terminals of said 11th and 12th transistors.

6. The circuit according to claim 4, further comprising another differential pair of transistors having a conductivity type opposite that of said differential pair of transistors;

wherein said another differential pair of the opposite conductivity type has an input pair connected to a pair of inputs of said differential pair and has a pair of outputs connected to said cascode current mirror circuit.

7. The circuit according to claim 4, further comprising:

a current source circuit arranged between the input end of said cascode current mirror circuit and the input end of said another cascode current mirror circuit; and another current source circuit arranged between the output end of said cascode current mirror circuit and the output end of said another cascode current mirror circuit.

8. The circuit according to claim 1, further comprising an output amplifying stage having an input end connected to the output end of said cascode current mirror circuit and an output end connected to the output terminal of said differential amplifying circuit.

9. The circuit according to claim 4, further comprising an output amplifying stage having input ends connected to respective ones of the output end of said cascode current mirror circuit and the output end of said another cascode current mirror circuit, and an output end connected to the output terminal of said differential amplifying circuit.

10. The circuit according to claim 9, wherein said output amplifying stage includes:

a first output transistor connected between the first power supply and the output terminal of said differential amplifying circuit and having a control terminal connected to the output end of said cascode current mirror circuit; and a second output transistor connected between the second power supply and the output terminal of said differential amplifying circuit and having a control terminal connected to the output end of said another cascode current mirror circuit.

11. The circuit according to claim 1, further comprising an input changeover circuit that changes over connections between first and second inputs forming the pair of inputs of said differential pair and the input and output terminals of said differential amplifying circuit;

wherein said input changeover circuit controls changeover so as to connect the first and second inputs to the input terminal and the output terminal, respectively, of said differential amplifying circuit or so as to connect the first and second inputs to the output terminal and the input terminal, respectively, of said differential amplifying circuit.

12. The circuit according to claim 11, wherein the changeover of voltage values of said first and second bias signals and the changeover of connections between the first and second inputs the pair of inputs of said differential pair and the input and output terminals of said differential amplifying circuit in the input changeover circuit are performed in operative association.

13. The circuit according to claim 12, further comprising another differential pair of transistors having the same conductivity type as that of said differential pair of transistors, having a pair of outputs connected to respective outputs of said differential pair and sharing said load circuit;

wherein connections between the pair of inputs of said another differential pair of the same conductivity type and the corresponding input terminals also are changed over in operative association with the changeover of voltage values of said first and second bias signals.

14. The circuit according to claim 2, further comprising a circuit which, when one bias signal of the first and second bias signals has a voltage value that sets to an active state the transistor pair to which the one bias signal is connected, sets the other bias signal to a voltage value that sets to an inactive state the transistor pair to which this other bias signal is connected.

15. The circuit according to claim 5, further comprising a circuit which, when one bias signal of the third and fourth bias signals has a voltage value that sets to an active state the transistor pair to which the one bias signal is connected, sets the other bias signal to a voltage value that sets to an inactive state the transistor pair to which this other bias signal is connected.

16. A differential amplifying circuit comprising:

a first differential pair driven by a first current source and comprising a transistor pair of a first conductivity type;

a first cascode current mirror circuit forming a load circuit of said first differential pair;

a second differential pair driven by a second current source and comprising a transistor pair of a second conductivity type;

a second cascode current mirror circuit forming a load circuit of said second differential pair; and an output amplifying stage having input ends connected to respective ones of an output end of said first cascode current mirror circuit and an output end of said second cascode current mirror circuit, and an output end connected to an output terminal of said differential amplifying circuit;

wherein input pairs of the first and second differential pairs are coupled together;

said first cascode current mirror circuit includes a first transistor pair having control terminals coupled together, and second and third transistor pairs for receiving first and second bias signals at respective ones of coupled control terminals thereof;

said first to third transistor pairs are of a second conductivity type;

said second transistor pair is straight-connected between said first transistor pair and the input end and the output end of said first cascode current mirror circuit;

said third transistor pair is cross-connected between said first transistor pair and the input end and the output end of said first cascode current mirror circuit;

said second cascode current mirror circuit includes a fourth transistor pair having control terminals coupled together, and fifth and sixth transistor pairs for receiving third and fourth bias signals at respective ones of coupled control terminals thereof;

said fourth to sixth transistor pairs are of a first conductivity type;

said fifth transistor pair is straight-connected between said fourth transistor pair and the input end and the output end of said second cascode current mirror circuit;

said sixth transistor pair is cross-connected between said fourth transistor pair and the input end and the output end of said second cascode current mirror circuit;

the respective voltage values of said first and second bias signals applied to said second and third transistor pairs are controlled in such a manner that when one of these transistor pairs attains an active state, the other attains an inactive state;

the respective voltage values of said third and fourth bias signals applied to the fifth and sixth transistor pairs are controlled in such a manner that when one of these transistor pairs attains an active state, the other attains an inactive state;

activation and deactivation of the straight-connected second and fifth transistor pairs is controlled at the same timing; and activation and deactivation of the cross-connected third and sixth transistor pairs is controlled at the same timing.

17. The circuit according to claim 16, further comprising an input changeover circuit that changes over connections between coupled first and second inputs of the input pairs of said first and second differential pairs and the input and output terminals of the differential amplifying circuit;

wherein said input changeover circuit controls changeover so as to connect the first and second inputs to the input terminal and the output terminal, respectively, of said differential amplifying circuit when said second and fifth transistor pairs have been activated, and connect the first and second inputs to the output terminal and the input terminal, respectively, of said differential amplifying circuit when said third and sixth transistor pairs have been activated.

18. A differential amplifying circuit comprising:

at least one differential pair of transistors; and a load circuit connected to said differential pair; said load circuit comprising a cascode current mirror circuit including:

a first transistor pair; and a cascode section cascade-connected between said first transistor pair and an input end and an output end of said cascode current mirror circuit;

the configuration of connection between said first transistor pair and the input end and the output end of said cascode current mirror circuit, responsive to a control signal applied to thereto, being changed over between straight connection and cross connection via said cascode section.

19. A data driver having the differential amplifying circuit set forth in claim 1, wherein said differential amplifying circuit has an output terminal for driving a data line.

20. A display device having the differential amplifying circuit, which is set forth in claim 1, as a buffer circuit.

21. A cascode current mirror circuit, comprising:

first and second transistors having first signal terminals connected to a power supply and having control terminals coupled together;

third and fourth transistors having first signal terminals connected to second signal terminals of said first and second transistors, respectively, and having control terminals coupled together for being supplied with a first bias signal; and fifth and sixth transistors having first signal terminals connected to the second signal terminals of said second and first transistors, respectively, and having control terminals coupled together for being supplied with a second bias signal;

wherein the second signal terminals of said third and fifth transistors are coupled together to form an input end of said cascode current mirror circuit, and are connected to the coupled control terminals of said first and second transistors; and the second signal terminals of said fourth and sixth transistors are coupled together, forming an output end of said cascode current mirror circuit.

* * * * *